United States Patent
Shimano et al.

(10) Patent No.: US 11,063,197 B2
(45) Date of Patent: *Jul. 13, 2021

(54) COMPOUND, THERMOELECTRIC CONVERSION MATERIAL, AND METHOD FOR PRODUCING COMPOUND

(71) Applicants: Sumitomo Chemical Company, Limited, Tokyo (JP); Riken, Wako (JP)

(72) Inventors: Satoshi Shimano, Tsukuba (JP); Yasujiro Taguchi, Wako (JP); Yoshinori Tokura, Wako (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 165 days.

This patent is subject to a terminal disclaimer.

(21) Appl. No.: 16/088,465

(22) PCT Filed: Mar. 30, 2017

(86) PCT No.: PCT/JP2017/013370
§ 371 (c)(1),
(2) Date: Sep. 26, 2018

(87) PCT Pub. No.: WO2017/170914
PCT Pub. Date: Oct. 5, 2017

(65) Prior Publication Data
US 2019/0115517 A1    Apr. 18, 2019

(30) Foreign Application Priority Data

Mar. 31, 2016 (JP) .............................. JP2016-073744
Sep. 9, 2016 (JP) .............................. JP2016-177048

(51) Int. Cl.
*H01L 35/16* (2006.01)
*H01L 35/34* (2006.01)
(Continued)

(52) U.S. Cl.
CPC ............ *H01L 35/16* (2013.01); *C01B 19/002* (2013.01); *C22C 28/00* (2013.01); *H01L 35/32* (2013.01);
(Continued)

(58) Field of Classification Search
CPC ................................ H01L 35/16; C22C 28/00
(Continued)

(56) References Cited

U.S. PATENT DOCUMENTS 3,081,365 A    3/1963 Henderson et al.
2012/0097205 A1    4/2012 Iida et al.
(Continued)

FOREIGN PATENT DOCUMENTS

JP    54-61884 A    5/1979
JP    S64002379 A    1/1989
(Continued)

OTHER PUBLICATIONS

Abrikisov et al., "Doping of germanium telluride with bismuth and cooper," Inorganic Materials USA, vol. 18, No. 9, pp. 1286-1504 (1982) (Abstract Only).
(Continued)

*Primary Examiner* — Weiping Zhu
(74) *Attorney, Agent, or Firm* — Panitch Schwarze Belisario & Nadel LLP

(57) ABSTRACT

The present invention relates to a compound containing at least germanium, tellurium, bismuth and copper as constituent elements, wherein the longest axis of ubiquitous bismuth crystals and copper crystals is less than 2.0 μm.

16 Claims, 16 Drawing Sheets

(51) Int. Cl.
*C22C 28/00* (2006.01)
*C01B 19/00* (2006.01)
*H01L 35/32* (2006.01)

(52) U.S. Cl.
CPC .......... *H01L 35/34* (2013.01); *C01P 2002/60* (2013.01); *C01P 2002/72* (2013.01); *C01P 2002/74* (2013.01); *C01P 2004/04* (2013.01); *C01P 2006/32* (2013.01); *C01P 2006/40* (2013.01)

(58) Field of Classification Search
USPC .......................................................... 420/579
See application file for complete search history.

(56) References Cited

U.S. PATENT DOCUMENTS

| | | | | |
|---|---|---|---|---|
| 2015/0069284 | A1* | 3/2015 | Murai | H01L 35/26 252/62.3 T |
| 2016/0163944 | A1 | 6/2016 | Fujimoto et al. | |
| 2019/0109269 | A1* | 4/2019 | Shimano | H01L 35/32 |

FOREIGN PATENT DOCUMENTS

| | | |
|---|---|---|
| JP | 06-169110 A | 6/1994 |
| JP | 10-130755 A | 5/1998 |
| JP | 11-31849 A | 2/1999 |
| JP | 2002-026405 A | 1/2002 |
| JP | 2011029632 A | 2/2011 |
| JP | 2015-056491 A | 3/2015 |
| KR | 20160033758 A | 3/2016 |

OTHER PUBLICATIONS

Extended European Search Report dated Sep. 9, 2019 in EP Application No. 17775448.8.
Klikorka et al., "Some physical properties of Ternary germanium bismuth telluride (GeBi4Te7) semiconducting crystals," Journal of Physics and Chemistry of Solids, Pergamon Press, vol. 37, No. 5, pp. 477-479 (1976).
Abrikosov et al, "Electrophysical Properties of Alloys of GeTe-Based Solid Solutions in the Quasi-Ternary System GeTe—Bi2Te3—Cu2Te," Inorganic Materials, vol. 16, No. 8, pp. 953-957 (1981).
Abrikosov et al, "Doping of Germanium Telluride with Bismuth and Copper," Inorganic Materials, vol. 18, No. 9, pp. 1286-1290 (1983).
Int'l Search Report dated Jun. 13, 2017 in Int'l Application No. PCT/JP2017/013370.
Int'l Search Report dated Jun. 13, 2017 in Int'l Application No. PCT/JP2017/013362.
Office Action dated Aug. 11, 2020 in U.S. Appl. No. 16/088,630, by Shimano.
Office Action dated Dec. 8, 2020 in U.S. Appl. No. 16/088,630, by Shimano.
Office Action dated Oct. 26, 2020 in KR Application No. 1020187027100 (with English Machine Translation).
Office Action dated Feb. 2, 2021 in JP Application No. 2018509456.
Office Action dated Feb. 2, 2021 in JP Application No. 2018509458.
Office Action dated Apr. 30, 2021 in U.S. Appl. No. 16/088,630, by Shimano.

* cited by examiner

COMPOUND, THERMOELECTRIC CONVERSION MATERIAL, AND METHOD FOR PRODUCING COMPOUND

CROSS-REFERENCE TO RELATED APPLICATION

This application is a Section 371 of International Application No. PCT/JP2017/013370, filed Mar. 30, 2017, which was published in the Japanese language on Oct. 5, 2017 under International Publication No. WO 2017/170914 A1, the disclosure of which is incorporated herein by reference in its entirety.

TECHNICAL FIELD

The present invention relates to a compound, a thermoelectric conversion material, and a method for producing the compound.

Priority is claimed on Japanese Patent Application No. 2016-073744, filed Mar. 31, 2016, and Japanese Patent Application No. 2016-177048, filed Sep. 9, 2016, the contents of which are incorporated herein by reference.

BACKGROUND ART

Thermoelectric conversion devices that utilize the Seebeck effect are able to convert thermal energy into electrical energy. In other words, by using a thermoelectric conversion device, electric power can be obtained directly from thermal energy. For example, by using a thermoelectric conversion device, the waste heat from the engine of an automobile can be recovered, and a portion of that waste heat can then be converted to electric power. For example, waste heat from a factory can be recovered, and a portion of that waste heat converted to electric power.

In recent years, from the viewpoints of suppressing the consumption of energy resources and the emission of carbon dioxide, improvements in energy efficiency continue to be demanded ever more strongly. As a result, much research is being conducted with the aim of improving the performance of thermoelectric conversion.

The thermal efficiency and output characteristics obtained from a thermoelectric conversion device are limited by the performance of the thermoelectric conversion material that constitutes the thermoelectric conversion device. Consequently, much investigation is being undertaken into improving the performance of thermoelectric conversion materials.

Examples of heat sources having a high temperature range include the waste heat from automobiles and the waste heat from factories. Because the temperature of these waste heat sources is near 500° C., investigation of thermoelectric conversion materials that operate from room temperature to near 500° C. is being actively pursued. Examples of materials that exhibit a high thermoelectric figure of merit and high output factor in the temperature region near 500° C., and also have heat resistance, include thermoelectric conversion materials containing a germanium telluride-based compound.

Here, the thermal efficiency of a thermoelectric conversion material is represented by formulas shown below. The maximum thermal efficiency $\eta_{opt}$ obtainable using a thermoelectric conversion material is represented by a formula (1) shown below. In formula (1) shown below, $T_H$ represents the temperature at the high temperature end [units: K], $T_C$ represents the temperature at the low temperature end [units: K], $T_{ave}$ represents the average of $T_H$ and $T_C$ [units: K], and Z represents the average thermoelectric figure of merit [1/K] of the thermoelectric conversion material in the temperature range.

[Numerical formula 1]

$$\eta_{opt} = \frac{T_H - T_C}{T_H} \frac{\sqrt{1+ZT_{ave}} - 1}{\sqrt{1+ZT_{ave}} + \frac{T_C}{T_H}} \quad (1)$$

The thermoelectric figure of merit z [1/K] of a thermoelectric conversion material at a given temperature T is represented by a formula (2) shown below. Here, $\alpha$ [V/K], $\rho$ [$\Omega$m], and $\kappa$ [W/(mK)] represent the Seebeck coefficient, the resistivity, and the thermal conductivity respectively of the thermoelectric conversion material at a given temperature T.

[Numerical formula 2]

$$zT = \frac{\alpha^2}{\rho\kappa} T \quad (2)$$

A larger value for the physical property zT of the thermoelectric conversion material indicates a higher value for the maximum thermal efficiency $\eta_{opt}$ obtainable by thermoelectric conversion. The average of the thermoelectric figure of merit z of the thermoelectric conversion material in the temperature range that is used is deemed the thermoelectric figure of merit Z. In order to increase the thermal efficiency, it is desirable to obtain a high thermoelectric figure of merit z across a broad temperature range.

The output factor (also known as the power factor) [W/(mK$^2$)] is used as an indicator of the maximum output obtainable at a temperature T using a thermoelectric conversion material. The power factor is represented by a formula (3) shown below. In the formula (3) below, $\alpha$ [V/K] represents the Seebeck coefficient of the thermoelectric conversion material at a given temperature T, and $\rho$ [$\Omega$m] represents the resistivity.

[Numerical formula 3]

$$\text{Power Factor} = \frac{\alpha^2}{\rho} \quad (3)$$

A higher power factor for the thermoelectric conversion material as represented by the above formula (3) indicates a larger maximum output obtainable by thermoelectric conversion.

Non-Patent Documents 1 and 2 report on the Seebeck coefficient, the electrical conductivity, the mobility and the hole density of GeTe—Bi$_2$Te$_3$—Cu$_2$Te-based materials. Non-Patent Documents 1 and 2 disclose that germanium, tellurium, bismuth and copper were used as raw materials, with sample materials being obtained by sealing these raw materials in a vacuum, performing heating in an electric furnace at 1197° C. for 5 hours followed by air-cooling, subsequently subjecting the product to annealing to achieve homogenization by performing heating in an argon atmosphere at 547° C. for 600 hours, and then switching the electric furnace off and allowing the sample to cool.

As a result, it is disclosed that the hole density p of the GeTe—Bi$_2$Te$_3$—Cu$_2$Te-based materials were lower than the hole densities p of GeTe—Bi$_2$Te$_3$-based materials and GeTe—Cu$_2$Te-based materials. It is also disclosed that the Seebeck coefficient of the GeTe—Bi$_2$Te$_3$—Cu$_2$Te-based samples was larger than the Seebeck coefficient of GeTe—Bi$_2$Te$_3$-based materials and GeTe—Cu$_2$Te-based materials. It is also disclosed that the electrical conductivity of the GeTe—Bi$_2$Te$_3$—Cu$_2$Te-based samples was smaller than the electrical conductivity of GeTe—Bi$_2$Te$_3$-based materials and GeTe—Cu$_2$Te-based materials.

However, Non-Patent Documents 1 and 2 make no disclosure of thermal conductivity data for the samples, meaning there is also no disclosure regarding the thermoelectric figure of merit z or zT.

PRIOR ART LITERATURE

Non-Patent Documents

Non-Patent Document 1: Inorganic Materials (Translation of Neorganicheskie Materialy), volume 16, Number 8, pages 953 to 957 (1981)
Non-Patent Document 2: Inorganic Materials (Translation of Neorganicheskie Materialy), volume 18, Number 9, pages 1286 to 1290 (1983)

SUMMARY OF INVENTION

Problems to be Solved by the Invention

When performing thermal recovery of waste heat from automobiles and factories, and then using that waste heat as electric power, it is desirable that a large output is obtained as electric power, and that the energy efficiency is high. In order to achieve these effects, it is desirable that the thermoelectric conversion material that constitutes the thermoelectric conversion device has a high power factor and a high zT value.

The present invention has been developed in light of these circumstances, and has objects of providing a compound having a high power factor and a high zT value in the high-temperature region near 500° C., a thermoelectric conversion material containing the compound, and a method for producing the compound.

Means for Solving the Problems

As a result of intensive investigation, the inventors of the present invention developed the present invention. In other words, the present invention has the following aspects.

[1] A compound containing at least germanium, tellurium, bismuth and copper as constituent elements, wherein the longest axis of ubiquitous bismuth crystals and copper crystals is less than 2.0 μm.
[2] A compound containing at least germanium, tellurium, bismuth and copper as constituent elements, wherein an intensity ratio I(Ge)/I(GeTe) between a maximum intensity I(GeTe) of an XRD peak attributable to germanium telluride and a maximum intensity I(Ge) of an XRD peak attributable to germanium metal is not more than 0.025.
[3] The compound according to [2], wherein the longest axis of bismuth crystals and copper crystals, which are ubiquitous within the compound, is less than 2.0 μm.
[4] The compound according to any one of [1] to [3], having a rhombohedral crystal structure derived from germanium telluride.
[5] The compound according to any one of [1] to [4], represented by a chemical formula Ge$_{1+a-b-c}$Bi$_b$Cu$_c$Te (wherein −0.05≤a≤0.10, 0<b≤0.10, and 0<c≤0.10).
[6] The compound according to any one of [1] to [5], further containing another element besides germanium, tellurium, bismuth and copper as a constituent element.
[7] The compound according to [6], wherein the other element is one or more elements selected from among metal elements belonging to groups 1 to 15 of the periodic table.
[8] The compound according to [6] or [7], wherein the other element is one or more elements selected from among metal elements of groups 1, 2 and 11 to 15 of the periodic table.
[9] The compound according to any one of [6] to [8], wherein the other element is one or more elements selected from among metal elements of groups 11 to 15 of the periodic table.
[10] The compound according to [6], wherein the other element is one or more elements selected from among non-metal elements of groups 15 to 17 of the periodic table.
[11] The compound according to [6] or [11], wherein the other element is one or more elements selected from among non-metal elements of group 16 of the periodic table.
[12] The compound according to [6], wherein the other element is one or more elements selected from the group consisting of lead, silver and selenium.
[13] The compound according to any one of [6] to [12], represented by a chemical formula Ge$_{1+a-b-c-d}$Bi$_b$Cu$_c$M$_d$Te$_{1-e}$X$_e$ (wherein M represents a metal element other than germanium, bismuth and copper, X represents a non-metal element other than tellurium, −0.05≤a≤0.10, 0<b≤0.10, 0<c≤0.10, 0<d≤0.40, and 0<e≤0.40).
[14] The compound according to any one of [1] to [13], having a carrier density of not more than 3.0×10$^{20}$ cm$^{-3}$.
[15] The compound according to any one of [1] to [14], wherein striped crystal domains exist, the width of the crystal domains is at least 0.005 μm but not more than 1 μm, and the length of the crystal domains is at least 0.05 μm.
[16] A thermoelectric conversion material containing the compound according to any one of [1] to [15].
[17] A method for producing a compound containing at least germanium, tellurium, bismuth and copper as constituent elements, the method including:
a step of mixing raw materials composed of at least the elements of germanium, tellurium, bismuth and copper, and melting the raw materials by heating at 720° C. or higher, and
a step of quenching the melt using a liquid of less than 50° C.
[18] A method for producing a compound containing at least germanium, tellurium, bismuth and copper as constituent elements, the method including:
a step of powdering materials containing germanium, tellurium, bismuth and copper, and
a step of performing sintering at 400° C. or higher using a plasma sintering method.

Effects of the Invention

The present invention is able to provide a compound having a high power factor and a high zT value in the high-temperature region near 500° C., a thermoelectric conversion material containing the compound, and a method for producing the compound.

BRIEF DESCRIPTION OF THE DRAWINGS

FIG. 1.4 is an exploded top view of the thermoelectric conversion module.

EMBODIMENTS FOR CARRYING OUT THE INVENTION

<Compound>

First Embodiment

Figure 1:
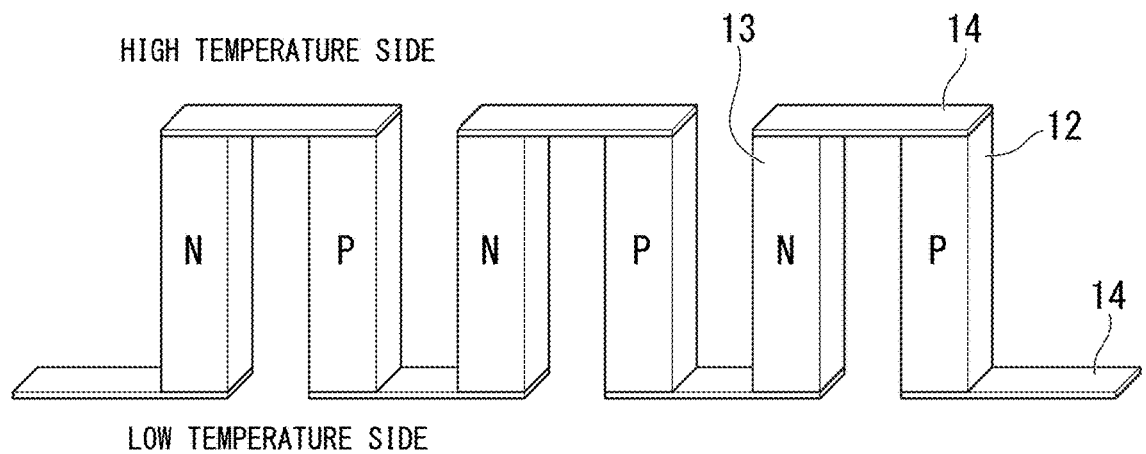
FIG. 1 is a side view schematically illustrating a thermoelectric conversion module.

A compound of a first embodiment contains at least germanium, tellurium, bismuth and copper as constituent elements, wherein the longest axis of ubiquitous bismuth crystals and copper crystals is less than 2.0 µm. In this description, ubiquitous refers to the distribution of each constituent element within the compound. It is more preferable that the compound is a germanium telluride doped with bismuth and copper. In other words, a compound in which bismuth and copper are subjected to solid dissolution in germanium telluride, and are arranged within the crystal lattice of, or between the atoms of, the germanium telluride.

Another aspect of the present invention is a compound containing at least germanium, tellurium, bismuth and copper, wherein at least a portion of the bismuth and copper form respective crystals within the compound, and the longest axes of the bismuth crystals and the copper crystals within the compound are each less than 2.0 µm.

In the compound of the first embodiment, the longest axis of the bismuth crystals and the copper crystals which are ubiquitous within the compound is less than 2.0 µm. In other words, in the compound of the first embodiment, the bismuth crystals and the copper crystals exist uniformly throughout the compound, and segregation of the elements is minor. In this description, segregation refers to a state wherein, when a melt of a metal or alloy composed of a plurality of elements solidifies, a portion of the elements dispersed within the metal or alloy crystallize, and also refers to those crystals. Accordingly, when the compound of the first embodiment is incorporated in a thermoelectric conversion material, a high power factor and high zT value can be achieved.

[Composition Distribution of Compound]

The composition of the compound of the first embodiment can be analyzed from a composition distribution diagram of a sample of the compound obtained, for example, using a scanning electron microscope (hereinafter sometimes abbreviated as SEM) fitted with an energy dispersive X-ray spectrometer (hereinafter sometimes abbreviated as EDX).

The compound of the first embodiment is analyzed under conditions in which the composition distribution of bismuth crystals and copper crystals of 0.2 µm or larger can be clearly identified. Conditions in which the composition distribution of bismuth crystals and copper crystals of 0.2 µm or larger can be clearly identified include the conditions described in the following examples. In this description, the "longest axis" can be calculated from the SEM image, and means the longest axis among any arbitrary axis (length) in a two-dimensional cross section of any of the ubiquitous bismuth crystals and copper crystals that appear in the SEM image.

In the compound of the first embodiment, the longest axis of the bismuth crystals and copper crystals which are ubiquitous within the compound is less than 2 µm, and in order to obtain a high zT value and high output characteristics across a broader temperature range, the longest axis of the bismuth crystals and copper crystals which are ubiquitous within the compound is preferably not more than 1.5 µm, more preferably not more than 1.0 µm, and even more preferably 0.5 µm or less.

In another aspect of the present invention, the longest axis of the bismuth crystals and copper crystals which are ubiquitous within the compound is at least 0.001 µm but less than 2.0 µm, and in order to obtain a high zT value and high output characteristics across a broader temperature range, is preferably at least 0.002 µm but not more than 1.5 µm, more preferably at least 0.005 µm but not more than 1.0 µm, and even more preferably at least 0.01 µm but not more than 0.5 µm.

The longest axes of the bismuth crystals and the copper crystals may be of the same length, or of different lengths, provided they are both less than 2.0 µm. In those cases where the longest axis differs for the bismuth crystals and the copper crystals, the difference between the longest axis of the bismuth crystals and the longest axis of the copper crystals is preferably greater than 0 µm but less than 1.0 µm, more preferably greater than 0 µm but not more than 0.75 µm, even more preferably greater than 0 µm but not more than 0.5 µm, and most preferably greater than 0 µm but not more than 0.25 µm.

Second Embodiment

A compound of a second embodiment contains at least germanium, tellurium, bismuth and copper as constituent elements, wherein an intensity ratio I(Ge)/I(GeTe) between a maximum intensity I(GeTe) of an XRD peak attributable to germanium telluride and a maximum intensity I(Ge) of an XRD peak attributable to germanium metal is not more than 0.025.

[Intensity Ratio of Powder X-Ray Diffraction Peaks for Compound]

The intensity ratio I(Ge)/I(GeTe) between the maximum intensity I(GeTe) of the XRD peak attributable to germanium telluride and the maximum intensity I(Ge) of the XRD peak attributable to germanium metal can be calculated from a powder X-ray diffraction pattern.

In this embodiment, I(Ge)/I(GeTe) is preferably not more than 0.025. In order to obtain a high zT value and high output characteristics across a broader temperature range, for example from 200° C. to 500° C., the value of I(Ge)/I(GeTe) is more preferably less than 0.015, and it is even more preferable that an XRD peak attributable to germanium metal cannot be detected, namely that I(Ge)/I(GeTe) is 0.

It is preferable that the compound of the second embodiment contains at least germanium, tellurium, bismuth and copper as constituent elements, wherein the longest axis of the ubiquitous bismuth crystals and copper crystals is less than 2.0 µm.

The description relating to the longest axis of the bismuth crystals and copper crystals in the compound of the second embodiment is the same as the description provided above relating to the longest axis of the bismuth crystals and copper crystals in the compound of the first embodiment.

[Compound Crystal Structure]

The crystal structure of the compound of the first embodiment and the second embodiment can be analyzed, for example, based on the powder X-ray diffraction pattern obtained using a powder X-ray diffractometer. Germanium telluride is known to have two types of crystal forms, namely α-GeTe which has a rhombohedral structure of the R3m space group, and γ-GeTe which has a cubic structure of the Fm-3m space group. The compound of the present invention preferably has an α-GeTe crystal structure having a rhombohedral structure of the R3m space group. It is even more preferable that the compound of the present invention contains no γ-GeTe having a cubic structure of the Fm-3m space group, and has only the α-GeTe crystal structure having a rhombohedral structure of the R3m space group.

[Composition of Compound]

The composition of the compound of the first embodiment and the second embodiment is characterized by containing germanium, tellurium, bismuth and copper.

In order to suppress segregation in the composition, and increase zT and the power factor, the compound preferably has a composition with a range represented by a chemical formula $Ge_{1+a-b-c}Bi_bCu_cTe$, wherein $-0.05 \leq a \leq 0.10$, $0 < b \leq 0.10$, and $0 < c \leq 0.10$. It is more preferable that $0 \leq a \leq 0.05$, $0.02 \leq b \leq 0.10$, and $0.02 \leq c \leq 0.10$.

The composition of the compound of the first embodiment and the second embodiment may also include other elements besides germanium, tellurium, bismuth and copper for the purpose of adjusting material properties of the compound such as the electronic properties, magnetic properties, thermal properties and mechanical properties.

The compound of the first embodiment and the second embodiment may include only a metal element, only a non-metal element, or both a metal element and a non-metal elements, as these other elements.

From the viewpoint of adjusting the electronic properties and thermal properties, the above metal element is preferably a metal element of groups 1 to 15 of the periodic table. From the viewpoint of having a particularly strong effect on the electronic properties and thermal properties, a metal element of group 1, 2, or 11 to 15 is more preferable. From the viewpoint of the stability of the compound, a metal element of groups 11 to 15 is even more preferable. Examples of metal elements of groups 11 to 15 include copper, silver, gold, zinc, cadmium, mercury, aluminum, gallium, indium, thallium, tin, palladium, and antimony. From the viewpoint of adjusting the thermoelectric conversion properties of the compound to increase zT and the power factor over a broad temperature range, lead, silver or antimony is preferable, and among these, lead or silver is particularly preferable.

In another aspect of the present invention, compounds containing germanium, tellurium, bismuth, copper, antimony and silver as constituent elements are excluded.

In the present invention, the longest axis of crystals of the above metal element, which are ubiquitous within the compound, is preferably at least 0.001 µm but less than 2.0 µm. In order to obtain a high zT value and high output characteristics across a broader temperature range, the longest axis of crystals of the above metal element is More preferably at least 0.005 µm but not more than 1.0 µm, and even more preferably at least 0.01 µm but not more than 0.5 µm.

Provided that the longest axes of the crystals of bismuth, copper and the metal element described above are all less than 2.0 µm, the longest axes may be of the same length, or of different lengths. In those cases where the longest axes of the crystals differ between the crystals of bismuth, copper and the above metal element, the difference between the longest axis of the element for which the longest axis of the crystals is longest and the longest axis of the element for which the longest axis of the crystals is shortest is preferably greater than 0 µm but less than 1.0 µm, more preferably greater than 0 µm but not more than 0.5 µm, and even more preferably greater than 0 µm but not more than 0.25 µm.

Any one of the above metal elements may be included alone in the compound, or two or more elements may be included. The amount of each of the above metal elements in the compound is, independently, typically from 0.005 mol to 0.3 mol, and preferably from 0.010 mol to 0.2 mol, per 1 mol of the tellurium in the compound.

From the viewpoint of adjusting the electronic properties and thermal properties of the compound, the non-metal element is preferably a non-metal element of groups 15 to 17 of the periodic table. From the viewpoint of the stability of the compound, a non-metal element of group 16 is more preferable. Examples of non-metal elements of group 15 include nitrogen, phosphorus and arsenic. Examples of non-metal elements of group 16 include oxygen, sulfur and selenium. Examples of non-metal elements of group 17 include fluorine, chlorine, bromine and iodine. From the viewpoint of adjusting the thermoelectric conversion properties of the compound and being able to increase zT and the power factor, selenium is particularly preferable.

Any one of the above non-metal elements may be included alone in the compound, or two or more elements may be included. The amount of each of the above non-metal elements in the compound is, independently, typically from 0.01 mol to 0.3 mol, and preferably from 0.01 mol to 0.2 mol, per 1 mol of the tellurium in the compound.

When the composition of the compound of the first embodiment and the second embodiment includes a metal element M and/or a non-metal element X as other elements besides the germanium, tellurium, bismuth and copper, in order to prevent segregation in the composition, and increase zT and the power factor, the compound preferably has a composition with a range represented by a chemical formula $Ge_{1+a-b-c-d}Bi_bCu_cM_dTe_{1-e}X_e$ (wherein M represents a metal element other than germanium, bismuth and copper, X represents a non-metal element other than tellurium, $-0.05 \leq a \leq 0.10$, $0 < b \leq 0.10$, $0 < c \leq 0.10$, $0 \leq d \leq 0.40$, and $0 \leq e \leq 0.40$). It is more preferable that, $0 \leq a \leq 0.05$, $0.02 \leq b \leq 0.10$, $0.02 \leq c \leq 0.10$, $0 \leq d \leq 0.30$, and $0 \leq e \leq 0.20$.

[Carrier Density]

In the compound of the present invention, in order to increase the Seebeck coefficient within the range in which the resistivity does not become too large, thereby increasing the output characteristics and zT, the carrier density at 300 K is preferably not more than $3.0 \times 10^{20}$ cm$^{-3}$. In terms of achieving superior thermoelectric performance at temperatures near room temperature and at high temperature, the carrier density is more preferably from $5.5 \times 10^{19}$ cm$^{-3}$ to $3.0 \times 10^{20}$ cm$^{-3}$. In this description, the term carrier refers to electrons and positive holes. The carrier density indicates the abundance of electrons or holes in the compound per unit of volume.

For example, five-terminal Hall measurement with a physical property measurement system PPMS (manufactured by Quantum Design, Inc.) and a special-purpose DC resistance sample pack can be used for measuring the carrier density of a sample. The Hall measurement can be performed by stabilizing the sample temperature, applying a magnetic field perpendicularly to the sample surface, and measuring the Hall resistance. The Hall coefficient is calculated from the slope of the Hall resistance relative to the magnetic field, and the carrier density is then calculated from the Hall coefficient. At temperatures near room temperature, noise can sometimes cause hysteresis in the Hall resistance, and therefore measurement is preferably performed at low temperature.

[Crystal Domains]

It is preferable that the compound of the first embodiment and the second embodiment has striped crystal domains within the crystals. A crystal domain refers to a region where crystals are oriented in the same direction. Crystal domains can be observed, for example, in a transmission electron microscope (hereinafter sometimes abbreviated as TEM) image obtained using a TEM. In the first embodiment and the second embodiment, it is preferable that a plurality of striped crystal domains are observed. In this description, the width of a crystal domain refers to the width of a dark portion or a light portion observed as a stripe in the TEM image, whereas the length of a crystal domain refers to the length of the dark portion or light portion. The width of a crystal domain is shorter than the length, and the width is preferably at least 0.005 μm but not more than 1 μm. The length is preferably at least 0.05 μm, and more preferably 0.1 μm or greater. In another aspect of the present invention, the length of a crystal domain is preferably at least 0.05 μm but not more than 50 μm, and is more preferably at least 0.1 μm but not more than 20 μm.

<Thermoelectric Conversion Material>

A thermoelectric conversion material of the present invention may contain the compound of the first embodiment or second embodiment described above as a material. The amount of the first embodiment or second embodiment described above in the thermoelectric conversion material is typically from 50% to 100%, preferably from 70% to 100%, more preferably from 80% to 100%, and even more preferably from 90% to 100%. Provided the amount of the first embodiment or second embodiment in the thermoelectric conversion material falls within the above range, excellent thermoelectric conversion characteristics are displayed.

Aspects of the present invention include the thermoelectric conversion materials described below.

<1> A thermoelectric conversion material containing at least germanium, tellurium, bismuth and copper as constituent elements, wherein
zT at 200° C. is at least 0.60,
zT at 300° C. is at least 0.90,
zT at 400° C. is at least 1.20, and
zT at 500° C. is at least 1.30.

<2> A thermoelectric conversion material containing at least germanium, tellurium, bismuth and copper as constituent elements, wherein
the power factor [μW/(cmK$^2$)] at 200° C. is at least 20,
the power factor [μW/(cmK$^2$)] at 300° C. is at least 20,
the power factor [μW/(cmK$^2$)] at 400° C. is at least 30, and
the power factor [μW/(cmK$^2$)] at 500° C. is at least 30.

<3> A thermoelectric conversion material containing at least germanium, tellurium, bismuth and copper as constituent elements, and
further containing at least one element selected from the group consisting of lead, silver and antimony, wherein
zT at 200° C. is at least 0.55,
zT at 300° C. is at least 0.90,
zT at 400° C. is at least 1.10, and
zT at 500° C. is at least 1.20.

<4> A thermoelectric conversion material containing at least germanium, tellurium, bismuth and copper as constituent elements, and
further containing silver or antimony, wherein
the power factor [μW/(cmK$^2$)] at 200° C. is at least 20,
the power factor [μW/(cmK$^2$)] at 300° C. is at least 20,
the power factor [μW/(cmK$^2$)] at 400° C. is at least 25, and
the power factor [μW/(cmK$^2$)] at 500° C. is at least 25.

<5> A thermoelectric conversion material containing at least germanium, tellurium, bismuth, copper and selenium as constituent elements, wherein
zT at 200° C. is at least 0.95,
zT at 300° C. is at least 1.20, and
zT at 400° C. is at least 1.40.

<6> A thermoelectric conversion material containing at least germanium, tellurium, bismuth, copper and selenium as constituent elements, wherein the power factor [μW/(cmK$^2$)] at 200° C. is at least 20,
the power factor [μW/(cmK$^2$)] at 300° C. is at least 20,
the power factor [μW/(cmK$^2$)] at 400° C. is at least 30, and
the power factor [μW/(cmK$^2$)] at 500° C. is at least 30.

Aspects of the present invention include the thermoelectric conversion methods described below.

[1] A thermoelectric conversion method wherein thermoelectric conversion is performed by applying heat to one end of a compound containing at least germanium, tellurium, bismuth and copper as constituent elements, and having a longest axis of bismuth crystals and copper crystals which are ubiquitous within the compound of less than 2.0 μm, thereby generating a temperature difference in the compound with the one end functioning as the high temperature side and the other end functioning as the low temperature side.

[2] A thermoelectric conversion method wherein thermoelectric conversion is performed by applying heat to one end of a compound containing at least germanium, tellurium, bismuth and copper as constituent elements, and having an intensity ratio I(Ge)/I(GeTe) between a maximum intensity I(GeTe) of an XRD peak attributable to germanium telluride and a maximum intensity I(Ge) of an XRD peak attributable to germanium metal of not more than 0.025, thereby generating a temperature difference in the compound with the one end functioning as the high temperature side and the other end functioning as the low temperature side.

[3] The thermoelectric conversion method according to [2], wherein the longest axis of bismuth crystals and copper crystals, which are ubiquitous within the compound, is less than 2.0 μm.

The thermoelectric conversion material of the present invention is a material which contains the compound of the first embodiment or the second embodiment, and has thermoelectric conversion properties, and is a material that is used for forming a thermoelectric conversion element provided in a thermoelectric conversion device. In this description, a thermoelectric conversion element is an element that utilizes the Seebeck effect or the like to convert thermal energy into electrical energy. A thermoelectric conversion element for which the Seebeck coefficient is positive is termed a p-type thermoelectric conversion element, and a thermoelectric conversion element for which the Seebeck coefficient is negative is termed an n-type thermoelectric conversion element. Here, thermoelectric conversion properties mean properties that convert thermal energy to electrical energy using the Seebeck effect, a thermomagnetic effect, or the spin Seebeck effect or the like.

<Thermoelectric Conversion Device>

A thermoelectric conversion device generally contains a p-type thermoelectric conversion element, an n-type thermoelectric conversion element, and metal electrodes. A thermoelectric conversion device illustrated in FIG. 16A has a p-type thermoelectric conversion element 12, an n-type thermoelectric conversion element 13, and metal electrodes 15, 16 and 17.

Figure 16A:
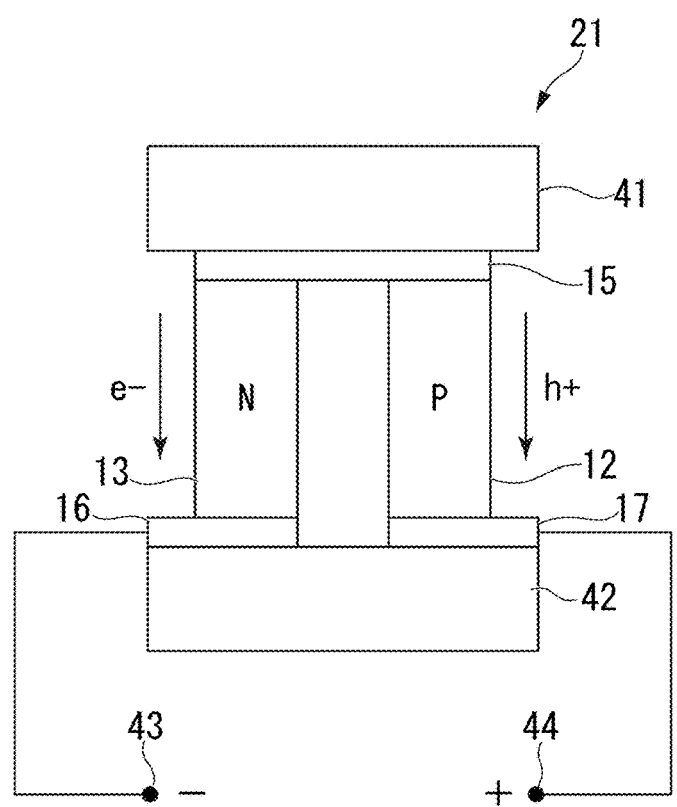
FIG. 16A is a diagram schematically illustrating a thermoelectric conversion device.
Figure 16B:
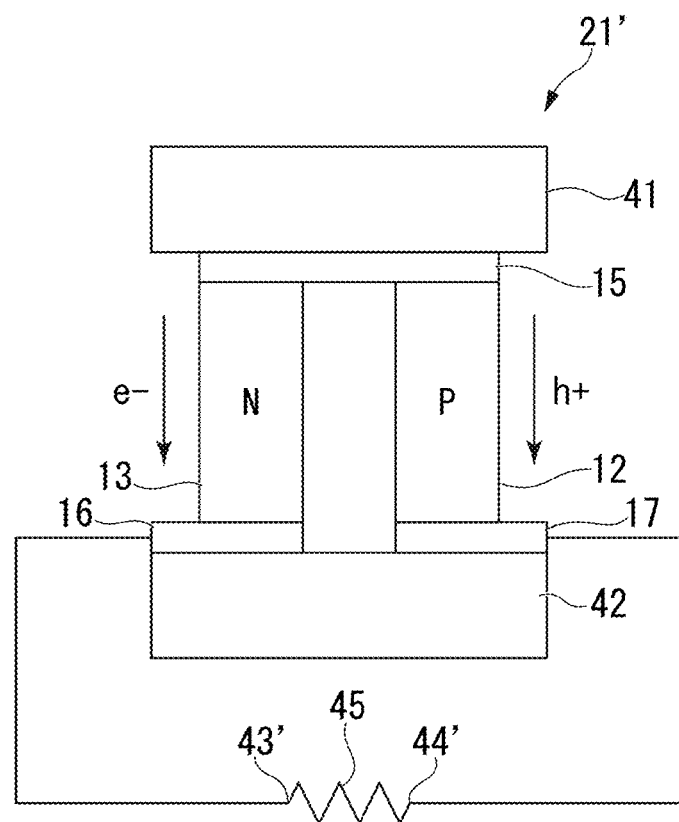
FIG. 16B is a diagram schematically illustrating a thermoelectric conversion device.

The thermoelectric conversion mechanism of the thermoelectric conversion device is described using FIG. 16A and FIG. 16B. In FIG. 16A, the thermoelectric conversion device 21 has the p-type thermoelectric conversion element 12, the n-type thermoelectric conversion element 13, a first metal electrode 15, a second metal electrode 16, and a third metal electrode 17. The p-type thermoelectric conversion element 12 is disposed between the first metal electrode 15 and the third metal electrode 17. The n-type thermoelectric conversion element 13 is disposed between the first metal electrode 15 and the second metal electrode 16. A heat source 41 may be disposed on the surface of the first metal electrode 15 opposite the surface that is connected to the p-type thermoelectric conversion element 12 and the n-type thermoelectric conversion element 13. A heat radiating plate 42 may be disposed on the surface of the second metal electrode 16 opposite the surface that is connected to the n-type thermoelectric conversion element 13, and the surface of the third metal electrode 17 opposite the surface that is connected to the p-type thermoelectric conversion element 12. For example, waste heat from an automobile or waste heat from a factory can be used as the heat source 41.

The heat source 41 transmits heat to the upper portions of the p-type thermoelectric conversion element 12 and the n-type thermoelectric conversion element 13 via the first metal electrode 15. On the other hand, heat from the lower portion of the n-type thermoelectric conversion element 13 is radiated from the heat radiating plate via the second metal electrode 16, and heat from the lower portion of the p-type thermoelectric conversion element 12 is radiated from the heat radiating plate via the third metal electrode 17. As a result, a temperature gradient develops between the upper portions and the lower portions of the p-type thermoelectric conversion element 12 and the n-type thermoelectric conversion element 13.

Positive holes (h+) bearing a positive charge in the p-type thermoelectric conversion element 12 move from the higher temperature upper end portion to the lower temperature lower end portion, thereby generating a thermoelectromotive force. On the other hand, electrons (e−) bearing a negative charge in the n-type thermoelectric conversion element 13 move from the higher temperature upper end portion to the lower temperature lower end portion, thereby generating a thermoelectromotive force. Because the potential differences of the p-type thermoelectric conversion element 12 and the n-type thermoelectric conversion element 13 are opposite, by electrically connecting the upper end portions of the two elements via the first metal electrode 15 as illustrated in FIG. 16A, the electromotive force between an electrode 43 and an electrode 44 becomes the sum of the thermoelectromotive force of the p-type thermoelectric conversion element 12 and the thermoelectromotive force of the n-type thermoelectric conversion element 13. In this example, the 43 side becomes the negative electrode and the 44 side becomes the positive electrode.

A thermoelectric conversion device 21' illustrated using FIG. 16B has a similar structure to FIG. 16A, but an external load 45 is connected between an electrode 43' and an electrode 44'. Examples of the external load 45 include a part of an electrical device, meaning a current can be provided to the electrical device. Examples of the electrical device include a battery, a capacitor, or a motor or the like.

The p-type thermoelectric conversion element and the n-type thermoelectric conversion element provided in the thermoelectric conversion device can each be obtained, for example, by mechanically processing a thermoelectric conversion material having p-type or n-type electronic properties into the desired shape.

The thermoelectric conversion material of the present invention described above can be used as the thermoelectric conversion material having p-type or n-type electronic properties. In other words, the thermoelectric conversion element may contain a processed product of the thermoelectric conversion material of the present invention.

The thermoelectric conversion element may form a layered structure, and for example, may have a layer formed from the thermoelectric conversion material of the present invention, and another layer. Examples of the other layer include a connection layer or a barrier layer.

The layer formed from the thermoelectric conversion material can be obtained by mechanically processing the compound of the present invention into a desired shape as the thermoelectric conversion material.

The thermoelectric conversion element may have a connection layer between the layer formed from the thermoelectric conversion material in the thermoelectric conversion element and a metal electrode. By including a connection layer in the thermoelectric conversion element, the thermoelectric conversion element and the metal electrode can be connected more favorably electrically and mechanically. As a result, the contact resistance between the thermoelectric conversion element and the metal electrode can be reduced. Examples of joint materials for forming the connection layer include elements that increase the carrier density, and specific examples include silver, gold, and platinum and the like. Although there are no particular limitations on the thickness of the connection layer, the thickness is preferably from 0.001 to 20 µm, and more preferably from 0.005 to 10 µm.

The thermoelectric conversion element may have a barrier layer between the layer formed from the thermoelectric conversion material in the thermoelectric conversion element and a metal electrode. By including a barrier layer, reaction caused by contact between the thermoelectric conversion material in the thermoelectric conversion element and the metal electrode can be prevented. In those cases where the thermoelectric conversion element has a connection layer described above, the thermoelectric conversion element may have a barrier layer between the layer formed from the thermoelectric conversion material and the connection layer in the thermoelectric conversion element. By including a barrier layer in the thermoelectric conversion element, reaction caused by contact between the thermoelectric conversion material and the connection layer in the thermoelectric conversion element can be prevented. Examples of the material for forming the barrier layer include elements that have the effect of preventing movement of at least one element contained in the layer formed from the thermoelectric conversion material, the connection layer or the metal electrode. Specific examples of such elements include aluminum, titanium, chromium, iron, cobalt, nickel, copper, zinc, molybdenum, silver and tantalum. Although there are no particular limitations on the thickness of the barrier layer, the thickness is preferably from 0.5 to 100 µm, and more preferably from 0.1 to 50 µm.

In order to prevent reaction between the thermoelectric conversion material and gases in the environment in which the thermoelectric conversion element is placed, or prevent the diffusion of substances that may be generated from the thermoelectric conversion material, the thermoelectric conversion element may have a protective film on the surface of the layer formed from the thermoelectric conversion material that is able to contact the gases. Examples of the elements contained in the protective film include silicon and oxygen. Although there are no particular limitations on the thickness of the protective film, the thickness is preferably from 0.5 to 100 µm, and more preferably from 1 to 50 µm.

A thermoelectric conversion module is a module formed by combining a plurality of thermoelectric conversion devices into a single unit. In other words, a thermoelectric conversion module has a plurality of thermoelectric conversion devices.

One aspect of the present invention is a thermoelectric conversion module described below.

A thermoelectric conversion module having:
a plurality of p-type thermoelectric conversion elements,
a plurality of n-type thermoelectric conversion elements, and
a plurality of metal electrodes, wherein
the plurality of p-type thermoelectric conversion elements and the plurality of n-type thermoelectric conversion elements are connected electrically in series in an alternating manner via the plurality of electrodes, and
the plurality of p-type thermoelectric conversion elements and the plurality of n-type thermoelectric conversion elements contain at least germanium, tellurium, bismuth and copper as constituent elements, at least a portion of the bismuth and copper form crystals in both the p-type thermoelectric conversion elements and the n-type thermoelectric conversion elements, and the longest axis of the bismuth crystals and copper crystals in both the p-type thermoelectric conversion elements and the n-type thermoelectric conversion elements is less than 2.0 µm.

One example of a thermoelectric conversion module is described using FIG. 1 and FIGS. 13 to 15.

Figure 13:
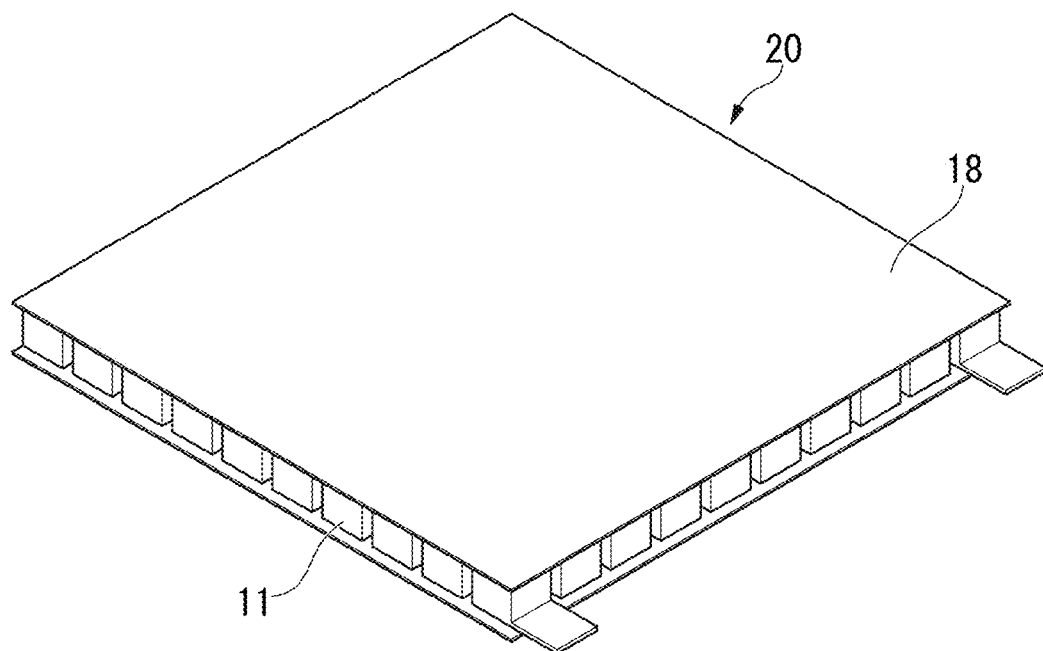
FIG. 13 is a perspective view illustrating the basic structure of a thermoelectric conversion module.

As illustrated in the perspective view of FIG. 13, which shows the basic structure of the thermoelectric conversion module, a plurality of thermoelectric conversion elements 11 are disposed in a lattice-like arrangement in the thermoelectric conversion module. Insulating plates 18 for reinforcing the thermoelectric conversion module 20 are installed on the top and bottom of the thermoelectric conversion module.

Figure 14:
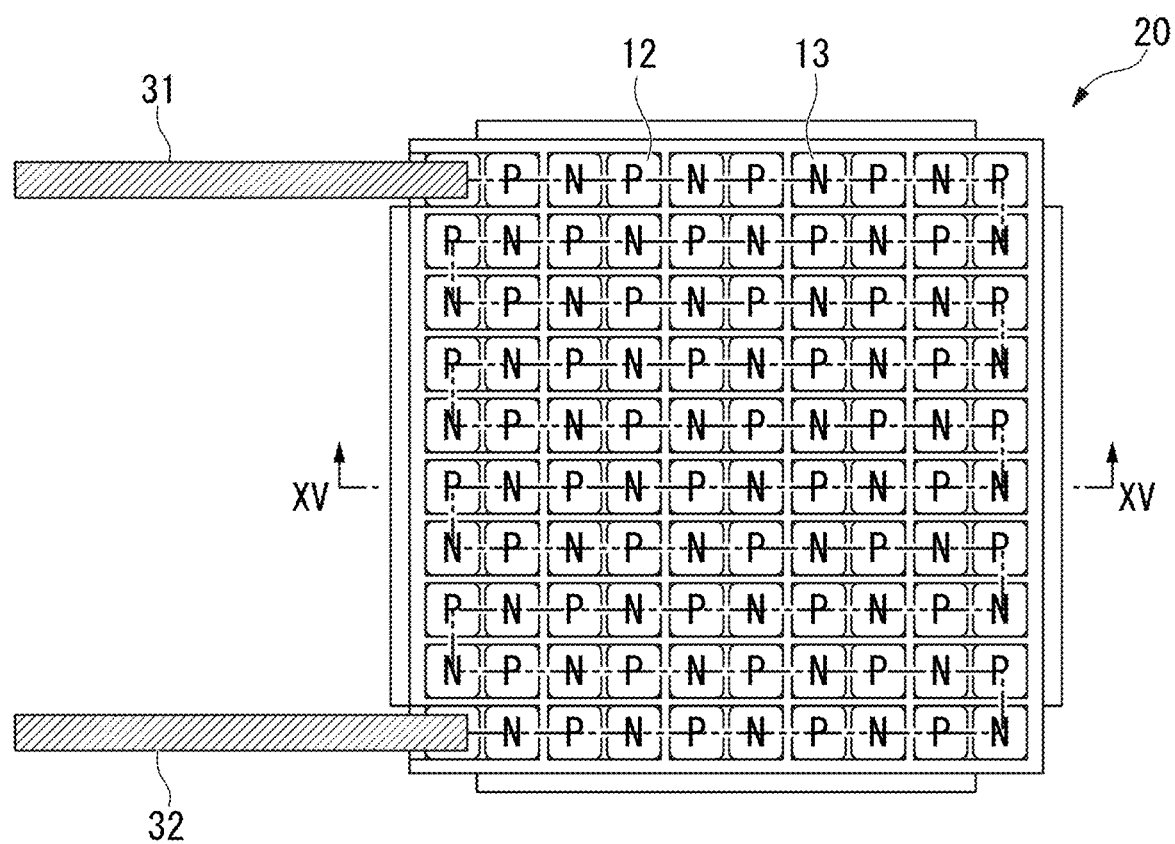

As illustrated in the exploded top view of the thermoelectric conversion module shown in FIG. 14, p-type thermoelectric conversion elements 12 and n-type thermoelectric conversion elements 13 are arranged in an alternating two-dimensional array in the thermoelectric conversion module 20. All of the p-type thermoelectric conversion elements 12 and the n-type thermoelectric conversion elements 13 are connected electrically in series from a lead wire 31 to a lead wire 32, as illustrated by a two-dot chain line in the figure. As illustrated in FIG. 1, which is a side view schematically illustrating the thermoelectric conversion module, and FIG. 15A and FIG. 15B, which are cross-sectional views along the line XV-XV in FIG. 1.4, all of the p-type thermoelectric conversion elements 12 and the n-type thermoelectric conversion elements 13 in the thermoelectric conversion module 20 are connected electrically in series via metal electrodes 14. The connection illustrated by the two-dot chain line in FIG. 14 is one example, and although there are no particular limitations on the manner in which the elements are connected, it is preferable that all of the p-type thermoelectric conversion elements 12 and the n-type thermoelectric conversion elements 13 are connected electrically in series in an alternating manner via metal electrodes. By connecting the lead wires 31 and 32 to the metal electrodes that are connected to the p-type thermoelectric conversion element and the n-type thermoelectric conversion element that are positioned at the two ends of the plurality of electrically series-connected p-type thermoelectric conversion elements 12 and n-type thermoelectric conversion elements 13, external output can be achieved.

Conventional lead wires can be used as the above lead wires.

Figure 15A:
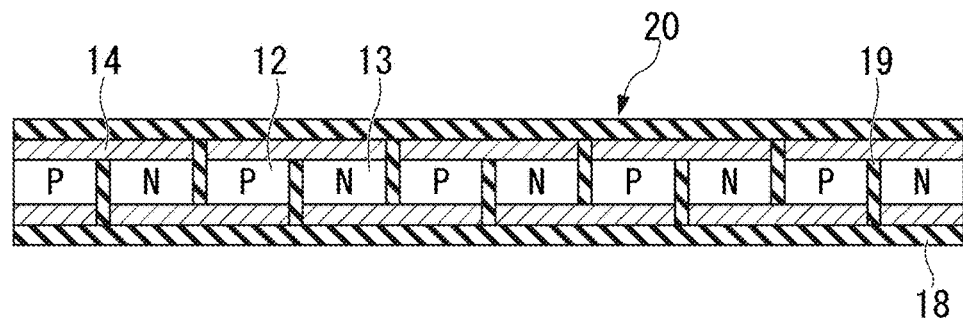
FIG. 15A is a cross-sectional schematic view along the line XV-XV in FIG. 14.

One aspect of the present invention is a thermoelectric conversion module illustrated in FIG. 15A, which has an insulator 19 between the p-type thermoelectric conversion elements 12 and the n-type thermoelectric conversion elements 13. By including the insulator 19, the strength of the p-type thermoelectric conversion elements 12 and the n-type thermoelectric conversion elements 13 can be reinforced, enabling the durability to be improved. From the viewpoint of the level of reinforcement, the insulator 19 preferably covers the entire side surface of the p-type thermoelectric conversion elements 12 and the n-type thermoelectric conversion elements 13.

Figure 15B:
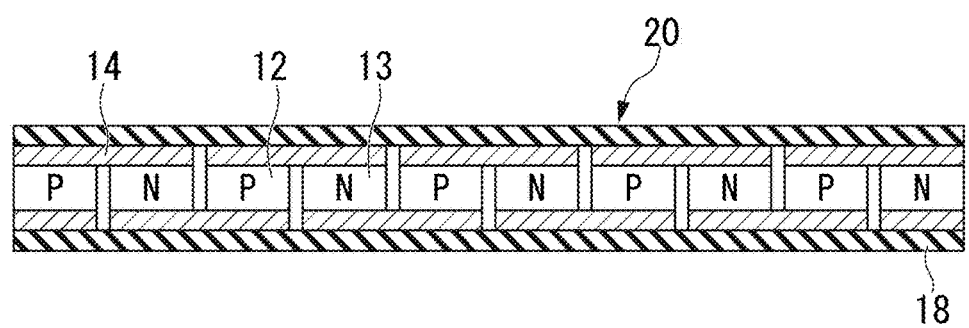
FIG. 15B is a cross-sectional schematic view along the line XV-XV in FIG. 14.

One aspect of the present invention is a thermoelectric conversion module illustrated in FIG. 15B, which does not have an insulator 19 between the p-type thermoelectric conversion elements 12 and the n-type thermoelectric conversion elements 13. By not having the insulator 19, external loss of heat from the p-type thermoelectric conversion elements 12 and the n-type thermoelectric conversion elements 13 is suppressed, and as a result, a high thermoelectromotive force can be obtained.

Examples of the above insulating plate and the above insulator include ceramic plates of alumina or aluminum nitride or the like.

As described above, because the p-type thermoelectric conversion elements and the n-type thermoelectric conversion elements in the thermoelectric conversion module are connected electrically in series, the output from the thermoelectric conversion module is a value substantially equal to the product of the output of one thermoelectric conversion element and the number of thermoelectric conversion elements used. In other words, in order to increase the output from the thermoelectric conversion module, increasing the output of each thermoelectric conversion element, or increasing the number of thermoelectric conversion elements used is effective.

As described above, because the p-type thermoelectric conversion elements and the n-type thermoelectric conversion elements are connected in an alternating arrangement, the relationship between the number (P) of p-type thermoelectric conversion elements and the number (N) of n-type thermoelectric conversion elements in the thermoelectric conversion module is typically P=N+1, P=N, or N=P+1 (wherein N and P are integers of 1 or greater).

The sum of the number of p-type thermoelectric conversion elements and the number of n-type thermoelectric conversion elements in the thermoelectric conversion module may be adjusted appropriately depending on conditions such as the size of the thermoelectric conversion module and the electromotive force required. In one aspect of the present invention, the sum of the number of p-type thermoelectric conversion elements and the number of n-type thermoelectric conversion elements in the thermoelectric conversion module is preferably from 50 to 1,000, more preferably from 50 to 500, and even more preferably from 50 to 250.

The compound and the thermoelectric conversion material of the present invention, in addition to use in conventional thermoelectric conversion devices using the Seebeck effect, can also be employed in thermoelectric conversion devices that use a thermomagnetic effect such as the Nernst effect, the Righi-Leduc effect and the Maggi-Righi-Leduc effect, or thermoelectric conversion devices that use a spin Seebeck effect based on a spin pumping effect or the inverse spin Hall effect.

[Thermoelectric Conversion Properties of Thermoelectric Conversion Material]

Indicators that can be used to show the thermoelectric conversion characteristics of the thermoelectric conversion material include zT, which is an indicator of the thermal efficiency, and the output factor (power factor), which is an indicator of the output. By using the Seebeck coefficient α [V/K], the resistivity ρ [Ωm], and the thermal conductivity κ [W/(mK)] which are the thermoelectric conversion properties at a temperature T, zT can be calculated using the formula (2) shown above, and the power factor can be calculated using the formula (3) shown above.

The present invention is able to provide a thermoelectric conversion material having a high zT value. Further, the present invention can also provide a thermoelectric conversion material having a high power factor. Accordingly, by using the thermoelectric conversion material of the present invention, a thermoelectric conversion module having high thermal efficiency and high output characteristics can be produced.

In particular, by using the thermoelectric conversion material of the present invention, the power factor and zT can be increased not only within a specific temperature range, but across a range from room temperature to 500° C. Accordingly, by using the thermoelectric conversion material of the present invention, thermoelectric conversion of comparatively high output and high efficiency can be achieved even from low temperatures near room temperature.

Even when fluctuations in the temperature of the waste heat occur due to the operating state of a device, comparatively high output and high efficiency can still be achieved.

<Method for Producing Compound>

First Embodiment

A first embodiment of a method for producing the compound is a method for producing a compound containing at least germanium, tellurium, bismuth and copper as constituent elements, and includes a step of mixing raw materials containing at least germanium, tellurium, bismuth and copper, and melting the raw materials by heating at 720° C. or higher (hereinafter referred to as "the melting step"), and a step of quenching the melt by immersion in a liquid of less than 50° C. (hereinafter referred to as "the quenching step").

Aspects of the present invention include the methods for producing a compound described below.

<1> A method for producing a compound containing at least germanium, tellurium, bismuth and copper as constituent elements, the method including:

a step of mixing raw materials containing at least germanium, tellurium, bismuth and copper, and melting the raw materials by heating at 720° C. or higher, and a step of quenching the melt by immersion in a liquid of less than 50° C.

<2> A method for producing a compound containing at least germanium, tellurium, bismuth and copper as constituent elements, and also containing at least one element selected from the group consisting of lead, silver, antimony and selenium, the method including:

a step of mixing raw materials containing at least germanium, tellurium, bismuth and copper, and also containing at least one element selected from the group consisting of lead, silver, antimony and selenium, and melting the raw materials by heating at 720° C. or higher, and a step of quenching the melt by immersion in a liquid of less than 50° C.

[Melting Step]

The melting step is a step of mixing raw materials containing at least germanium, tellurium, bismuth and copper, and melting the raw materials by heating at 720° C. or higher.

The maximum temperature during the heating in this embodiment is characterized by being 720° C. or higher. In order to melt the raw materials and improve the uniformity, heating at a temperature of 940° C. or higher that is higher than the melting point of germanium is preferable, and heating at a temperature of 1,090° C. or higher that is higher than the melting point of copper is more preferable.

In another aspect of the present invention, the maximum temperature during the heating in this embodiment is preferably from 720° C. to 1,500° C., and in order to melt the raw materials and improve the uniformity, heating at a temperature of 940° C. to 1,500° C. is more preferable, and heating at a temperature of 1,090° C. to 1,500° C. is even more preferable.

The rate of temperature increase during heating in this embodiment is preferably from 0.5 to 1,000° C./minute, and more preferably from 1 to 200° C./minute.

Further, heating is preferably performed for 0.1 to 100 hours, and more preferably for 0.5 to 20 hours.

There are no particular limitations on the melting method, and various methods may be used.

Examples of the melting method include heating using a resistance heating element, high-frequency-induced degradation, arc melting, and electron beam melting.

Examples of the crucible used include graphite, alumina, and cold crucibles, which may be used as appropriate in accordance with the heating method.

In order to prevent the raw materials described above and the ingot described below from deteriorating due to contact with the air or liquids, the raw materials and the ingot are heated, and then quenched in the subsequent quenching step, in an inert atmosphere of argon, nitrogen, or a vacuum or the like. The raw materials may be packed into an inert atmosphere ampule in advance, and then subjected to heating and cooling.

[Quenching Step]

The quenching step is performed after the aforementioned melting step of melting the mixture of raw materials containing germanium, tellurium, bismuth and copper at a temperature of at least 720° C. that represents the melting point of germanium telluride, and is a step of quenching the melt by immersion in a liquid of less than 50° C., thus obtaining an ingot containing germanium, tellurium, bismuth and copper.

In the quenching step of this embodiment, it is desirable that the temperature of the melt is cooled rapidly from a temperature at least as high as the melting point of the melt to a temperature of 100° C. or lower, and cooling to 100° C. or lower is preferably performed within 10 minutes. Cooling is more preferably performed within 5 minutes, and even more preferably within 1 minute.

Examples of materials that may be used as the liquid mentioned above include materials that are liquid at temperatures of 100° C. or lower, such as water, ice water, solutions containing water as the main component, liquid air and liquid nitrogen. In terms of being inexpensive and offering a high degree of safety, water, ice water, solutions containing water as the main component, and mixtures thereof are preferable.

This embodiment is characterized by having the quenching step described above. It is thought that by including the quenching step, bismuth and copper can be doped in a supersaturated state into the germanium telluride. As a result, it is surmised that by using this embodiment, low elemental segregation can be achieved in which the longest axis of the ubiquitous bismuth crystals and copper crystals is less than 2.0 μm.

In contrast, in the conventional air cooling method described below, it is surmised that the bismuth and copper do not dissolve in the germanium telluride matrix, resulting in precipitation of the bismuth and copper that exceeds the saturated composition. If bismuth and copper precipitate, then the longest axis of the bismuth crystals and copper crystals will become 2.0 μm or greater.

Second Embodiment

A second embodiment of a method for producing the compound is a method for producing a compound containing at least germanium, tellurium, bismuth and copper as constituent elements, and includes a step of powdering materials containing germanium, tellurium, bismuth and copper (hereinafter referred to as "the powdering step"), and a step of performing sintering at 400° C. or higher using a plasma sintering method (hereinafter referred to as "the plasma sintering step").

Aspects of the present invention include the methods for producing a compound described below.

<1> A method for producing a compound containing at least germanium, tellurium, bismuth and copper as constituent elements, the method including:

a step of powdering materials containing germanium, tellurium, bismuth and copper, and a step of sintering the powdered material at 400° C. or higher using a plasma sintering method, by passing a pulsed electric current through the powder while compressing the powder, thereby generating electrical discharges within the powder and heating the powder.

<2> A method for producing a compound containing at least germanium, tellurium, bismuth and copper as constituent elements, and also containing at least one element selected from the group consisting of lead, silver, antimony and selenium, the method including:

a step of powdering raw materials containing at least germanium, tellurium, bismuth and copper, and also containing at least one element selected from the group consisting of lead, silver, antimony and selenium, and a step of sintering the powdered material at 400° C. or higher using a plasma sintering method, by passing a pulsed electric current through the powder while compressing the powder, thereby generating electrical discharges within the powder and heating the powder.

[Powdering Step]

The powdering step is a step of powdering materials containing germanium, tellurium, bismuth and copper.

In the powdering step, an ingot containing germanium, tellurium, bismuth and copper is produced, and the ingot is then crushed and powdered using a ball mill or the like. The melting step and quenching step described above can be employed as the method for producing the ingot. Although there are no particular limitations on the particle size of the powdered fine particles, the particle size is preferably not more than 150 μm.

In another aspect of the present invention, the particle size of the powdered fine particles is preferably from 0.1 μm to 150 μm, and more preferably from 0.5 μm to 100 μm.

[Plasma Sintering Step]

The plasma sintering step is a step of performing sintering at 400° C. or higher using a plasma sintering method. A discharge plasma sintering step in this embodiment is a step of passing a pulsed electric current through the powder obtained in the powdering step by powdering compounds containing germanium, tellurium, bismuth and copper, while compressing the powder, thereby generating electrical discharges within the powder, and heating and sintering the sample to obtain a compound.

When the electric current is halted in the discharge plasma sintering step, heating stops and the sample cools rapidly. In order to prevent uneven distribution of the composition and enhance the characteristics of the thermoelectric conversion material, it is preferable that heating is performed at a prescribed temperature, and the discharge is then halted and the sample cooled.

In order to prevent the above compound containing germanium, tellurium, bismuth and copper from deteriorating due to contact with air, the discharge Plasma sintering step is preferably performed in an inert atmosphere of argon, nitrogen, or a vacuum or the like.

The compression in the discharge plasma sintering step is performed within a range from 0 to 100 MPa. In order to obtain a compound of high density, the compression is preferably at least 10 MPa, and more preferably 30 MPa or greater. In other words, in order to obtain a compound of high density, the compression in the discharge plasma sintering step is preferably from 10 MPa to 100 MPa, and more preferably from 30 MPa to 100 MPa.

The heating temperature in the discharge plasma sintering step is preferably significantly lower than the temperature at which the compound containing germanium, tellurium, bismuth and copper starts to melt, and is more preferably not higher than 650° C. A temperature of 600° C. or lower is more preferable. On the other hand, in order to promote sintering, heating is preferably performed at a comparatively high temperature, and the temperature is preferably at least 400° C. A temperature of 500° C. or higher is more preferable. In other words, the heating temperature in the discharge plasma sintering step is preferably from 400° C. to 650° C., and more preferably from 500° C. to 600° C.

The heating in the discharge plasma sintering step is preferably performed for 0.01 to 25 hours, and more preferably 0.05 to 1.0 hours.

This embodiment is characterized by including the sintering step described above. It is thought that by including the discharge plasma sintering step, the sample is cooled rapidly, thus enabling supersaturated bismuth and copper to be doped into the germanium telluride. Accordingly, it is surmised that by using this embodiment, low elemental segregation can be achieved in which the longest axis of the ubiquitous bismuth crystals and copper crystals is less than 2.0 µm.

Third Embodiment

A third embodiment of a method for producing the compound is a method for producing a compound containing at least germanium, tellurium, bismuth and copper as constituent elements, and includes a melting step of mixing raw materials containing at least germanium, tellurium, bismuth and copper, and melting the raw materials by heating at 720° C. or higher, a quenching step of quenching the melt by immersion in a liquid of less than 50° C. to obtain an ingot, a step of powdering the ingot, and a step of sintering the powder at 400° C. or higher using a plasma sintering method.

Aspects of the present invention include the methods for producing a compound described below.

<1> A method for producing a compound containing at least germanium, tellurium, bismuth and copper as constituent elements, the method including:
a step of mixing raw materials containing at least germanium, tellurium, bismuth and copper, and melting the raw materials by heating at 720° C. or higher,
a step of quenching the melt by immersion in a liquid of less than 50° C. to obtain an ingot,
a step of powdering the ingot, and
a step of sintering the powdered material at 400° C. or higher using a plasma sintering method, by passing a pulsed electric current through the powder while compressing the powder, thereby generating electrical discharges within the powder and heating the powder.

<2> A method for producing a compound containing at least germanium, tellurium, bismuth and copper as constituent elements,
and also containing at least one element selected from the group consisting of lead, silver, antimony and selenium, the method including:
a step of mixing raw materials containing at least germanium, tellurium, bismuth and copper, and also containing at least one element selected from the group consisting of lead, silver, antimony and selenium, and melting the raw materials by heating at 720° C. or higher,
a step of quenching the melt by immersion in a liquid of less than 50° C. to obtain an ingot,
a step of powdering the ingot, and
a step of sintering the powdered material at 400° C. or higher using a plasma sintering method, by passing a pulsed electric current through the powder while compressing the powder, thereby generating electrical discharges within the powder and heating the powder.

In this embodiment, descriptions relating to the melting step, the quenching step, the powdering step and the plasma sintering step are the same as the descriptions provided above for the melting step and the quenching step in the first embodiment of the method for producing a compound, and the powdering step and the plasma sintering step in the second embodiment of the method for producing a compound.

Because this embodiment combines the quenching step and the plasma sintering step, it is thought that satisfactory dissolution can be achieved without precipitation of the bismuth and copper.

As a result, it is surmised that by using this embodiment, low elemental segregation can be achieved in which the longest axis of the ubiquitous bismuth crystals and copper crystals is less than 2.0 µm.

EXAMPLES

The present invention is described below in further detail using examples. Analyses of the thermoelectric conversion characteristics and structures of compounds were conducted using the following methods.

1. Seebeck Coefficient

Measurements of the Seebeck coefficient $\alpha$ [V/K] and the resistivity $\rho$ [$\Omega$m] were performed using a thermoelectric conversion characteristics evaluation device ZEM-3 (manufactured by ULVAC-RIKO, Inc.). Samples used in the measurements were cut using a diamond cutter. A typical shape for the sample was height: 6.3 mm, width: 4 mm, and depth: 1.7 mm. R-type thermocouples used for temperature measurement and voltage measurement were secured to the sample so as to contact the sample at 2.7 mm intervals along the height direction. The sample was heated to a prescribed temperature in a helium gas atmosphere (0.01 MPa). Moreover, by heating one end of the sample, a temperature difference was produced along the height direction of the sample. The temperature difference ($\Delta T$) and the voltage difference ($\Delta V$) between the R-type thermocouples were measured. The temperature difference ($\Delta T$) was set to values within a range from 1 to 10° C. The voltage difference ($\Delta V$) was measured when three different temperature differences ($\Delta T$) were imparted to the sample. The value of the Seebeck coefficient $\alpha$ was calculated from the slope of the voltage difference ($\Delta V$) relative to the temperature difference ($\Delta T$).

2. Resistivity

In the measurement of the Seebeck coefficient using the thermoelectric conversion characteristics evaluation device ZEM-3 (manufactured by ULVAC-RIKO, Inc.), the resistivity was measured using a DC four-terminal method.

3. Power factor

The power factor [W/(mK$^2$)] was calculated using the above formula (3), using the measured Seebeck coefficient $\alpha$ [V/K] and resistivity $\rho$ [$\Omega$m].

4. Thermal Conductivity

The thermal conductivity $\kappa$ [W/(mK)] was calculated from the thermal diffusivity $\lambda$ [m$^2$/s], the heat capacity $C_p$ [J/g] and the density d [g/m$^3$], using a formula (4) shown below.

[Numerical formula 4]

$$\kappa = \lambda \times C_p \times d \quad (4)$$

Measurements of the thermal diffusivity $\lambda$, the heat capacity $C_p$ and the density d were performed using the same sample. The sample used for the measurements was cut using a diamond cutter. A typical shape for the sample was 4 mm×4 mm×0.5 mm.

5. Thermal Diffusivity

A laser flash analyzer LFA457 MicroFlash (manufactured by NETZSCH-Geratebau GmbH) was used for measurement of the thermal diffusivity $\lambda$. At the time of measurement, the surface of the sample was coated black with a carbon spray "Graphite 33" (manufactured by CRC industries Europe BVBA).

6. Heat Capacity

An EXSTAR DSC 7020 (manufactured by SII NanoTechnology Inc.) was used for measurement of the heat capacity $C_p$.

7. Density

A density measurement kit (manufactured by Mettler-Toledo International Inc.) was used for measurement of the density d, with the measurement performed at 20° C. using the Archimedes method, with water as the liquid.

8. Thermoelectric Figure of Merit z

The thermoelectric figure of merit z [1/K] was calculated from the Seebeck coefficient $\alpha$ [V/K] at an absolute temperature T as zT, the resistivity $\rho$ [$\Omega$m], and the thermal conductivity $\kappa$ [W/(mK)], using the above formula (2).

9. Crystal Structure Analysis

Analysis of the crystal structure was performed using a powder X-ray diffractometer RINT TTR-III (manufactured by Rigaku Corporation), by performing a powder X-ray diffraction measurement under the following conditions to obtain a powder X-ray diffraction pattern. The intensity ratio I(Ge)/I(GeTe) between the maximum intensity I(GeTe) of the XRD peak attributable to germanium telluride and the maximum intensity I(Ge) of the XRD peak attributable to germanium metal was calculated from the powder X-ray diffraction pattern.

Measurement apparatus: Powder X-ray diffractometer RINT TTR-III (manufactured by Rigaku Corporation)

X-ray generator: CuK$\alpha$ ray source, voltage: 30 kV, current: 400 mA

Slit: Variable slit (focusing method), slit width: 2 mm

X-ray detector: scintillation counter

Measurement range: diffraction angle $2\theta=10°$ to 90°

Sample preparation: powdered by mortar grinding

Sample stage: special-purpose glass substrate, thickness: 0.2 mm

10. Analysis of Composition Distribution

Analysis of the composition distribution of the compound was performed using a scanning electron microscope JEOL ISM-6701F (manufactured by JEOL Ltd.) fitted with an energy dispersive X-ray spectrometer Bruker AXS XFlash Detector 5030 (manufactured by Bruker AXS GmbH), and a composition distribution was obtained under the following conditions. The surface of the sample was polished in advance to a mirror surface, and was then subjected to finishing by wet polishing with a lapping film sheet 1 μm (manufactured by 3M Corporation).

SEM: JEOL ISM-6701F (manufactured by JEOL Ltd.), accelerating voltage: 1.5 kV, current: 20 μA.

EDX: XFlash Detector 5030 (manufactured by Broker AXS GmbH.)

Analysis software: QUANTAX 200 (manufactured by Broker AXS GmbH)

11. Analysis of Crystal Domains

Analysis of crystal domains was performed using a transmission electron microscope JEOL JEM2800 (manufactured by JEOL Ltd.) fitted with an electron probe having a diameter of 1 nm, and a TEM image of a surface corresponding with the ab plane of the R3m structure was obtained using the STEM mode at an accelerating voltage of 200 kV. The sample was appropriately exfoliated in advance, and an ion mill Gatan PIPS (manufactured by Gatan, Inc.) was used to perform finishing at room temperature using an Ar ion beam having an accelerating voltage of 2 kV.

12. Carrier Density

Five-terminal Hall measurement using a physical property measurement system PPMS (manufactured by Quantum Design, Inc.) and a special-purpose DC resistance sample pack was used for measurement of the carrier density p [cm$^{-3}$]. A typical shape for the sample was length: 6 mm×depth: 2 mm×thickness: 0.4 mm.

The Hail measurement was performed by adjusting the sample to a prescribed temperature, and then applying a magnetic field within a range from −5 T to 5 T perpendicularly to the sample surface and measuring the Hall resistance. The Hall coefficient was calculated from the slope of the Hall resistance relative to the magnetic field, and the carrier density was then calculated from the Hall coefficient.

Example 1

A compound of Example 1 was obtained via a quenching step (1) and a discharge plasma sintering step (2).

(1) Quenching Step

For raw materials, germanium (manufactured by Furuuchi Chemical Corporation, powder 100 mesh, purity: at least 99.999%), tellurium (manufactured by Osaka Asahi Metal Mfg. Co., Ltd., granular, 6NS-2 Grade), bismuth (manufactured by Osaka Asahi. Metal Mfg. Co., Ltd., granular, 6N Grade), and copper (manufactured by Kojundo Chemical Laboratory Co., Ltd., powder 850 μm pass, purity: at least 99.999%) were used.

The raw materials were weighed to achieve a composition of $Ge_{0.92}Bi_{0.04}Cu_{0.04}Te$, and a mixture was obtained using an agate mortar. Subsequently, 3.5 g of the mixture was placed in a quartz ampule (hemispherical base, inner diameter: 10 mm, outer diameter: 12 mm), and the ampule was sealed under reduced pressure of $3 \times 10^{-4}$ Pa or lower. The quartz ampule was then heated to 950° C. in an electric furnace, and the mixture was melted. The temperature was raised to 950° C. at a rate of 5° C./minute, and then held at 950° C. for 5 hours.

In the quenching step, the quartz ampule was removed from the 950° C. electric furnace, and immediately immersed in room temperature water. At this time, the mixture inside the quartz ampule was quenched, and solidified rapidly from the melted state to form an ingot. Cooling from the melted state at 950° C. to 100° C. or lower was achieved within one minute. The ingot was then recovered from the quartz ampule.

(2) Discharge Plasma Sintering Step

In the discharge plasma sintering step, a discharge plasma sintering apparatus Doctor Sinter Lab SPS-511S (manufactured by Fuji Electronic Industrial Co., Ltd.) was used. The ingot obtained in the quenching step was powdered by mortar grinding. The powder was then packed in a special-purpose carbon die, and a compound was obtained by performing discharge plasma sintering under the following conditions. The heating was performed for 10 minutes.

Apparatus: Doctor Sinter Lab SPS-511S (manufactured by Fuji Electronic Industrial Co., Ltd.)

Sample: powder 2.5 g

Die: special-purpose carbon die, inner diameter 10 mmø

Atmosphere: argon 0.05 MPa

Pressure: 40 MPa (3.1 kN)

Heating: 550° C., 10 minutes

The composition, production method, and material properties of the compound of Example 1 are shown in Table 1.

(Crystal Structure Analysis)

Figure 2A:
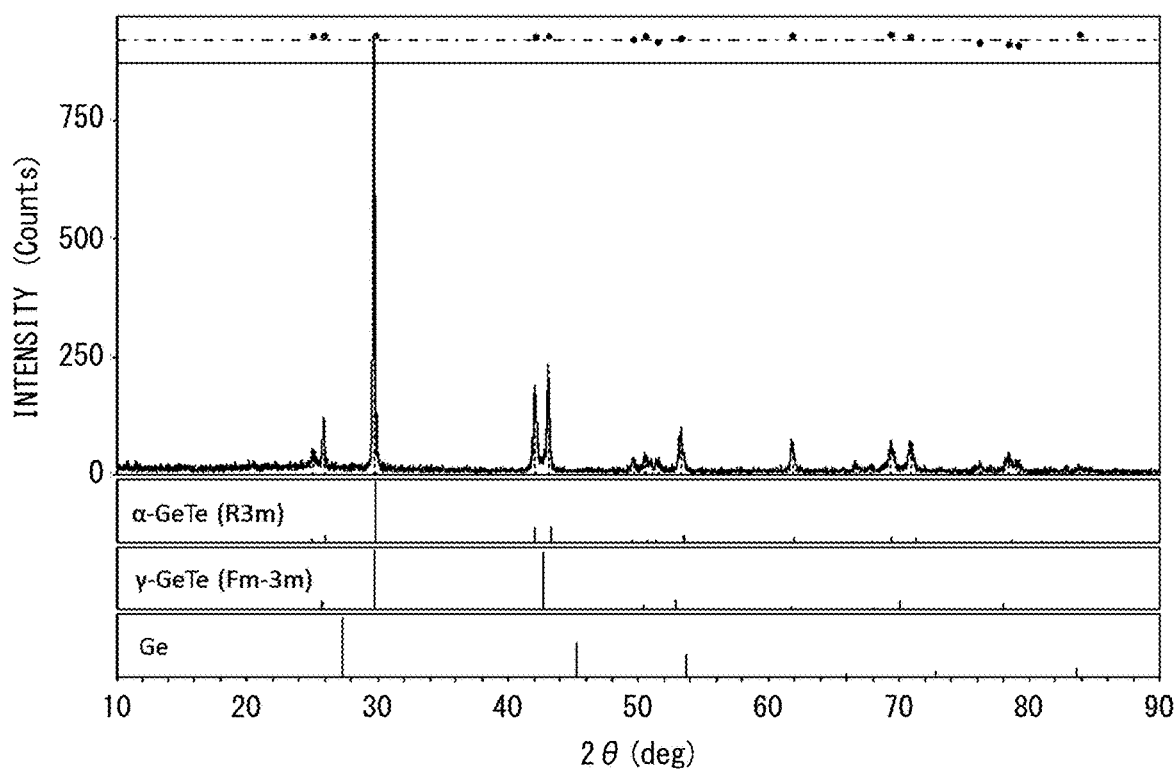
FIG. 2A is the powder X-ray diffraction pattern of the compound of Example 1.

A powder X-ray diffraction pattern for the compound of Example 1 is shown in FIG. 2A. Only peaks attributable to α-GeTe belonging to the R3m space group were observed. No peaks attributable to germanium metal were observed.

(Composition Segregation)

Figure 4A:
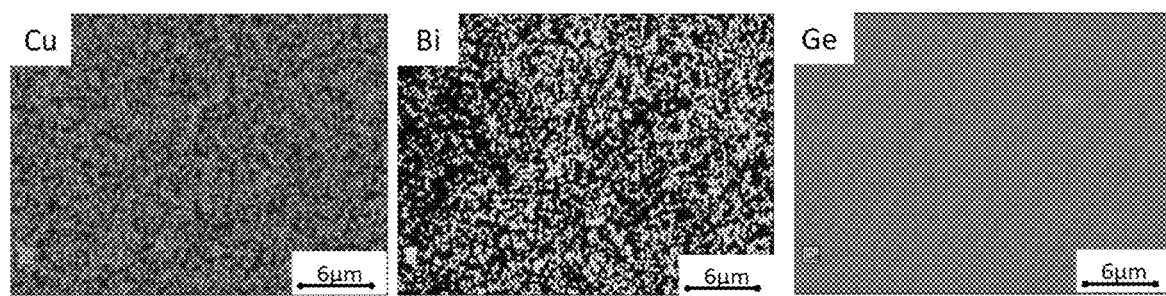
FIG. 4A is a diagram illustrating the composition distribution of the compound of Example 1.

The composition distribution of the compound of Example 1 is shown in FIG. 4A. The longest axis of copper segregation was 0.4 μm, and the longest axis of bismuth segregation was 0.3 μm.

(Crystal Domains)

Figure 6:
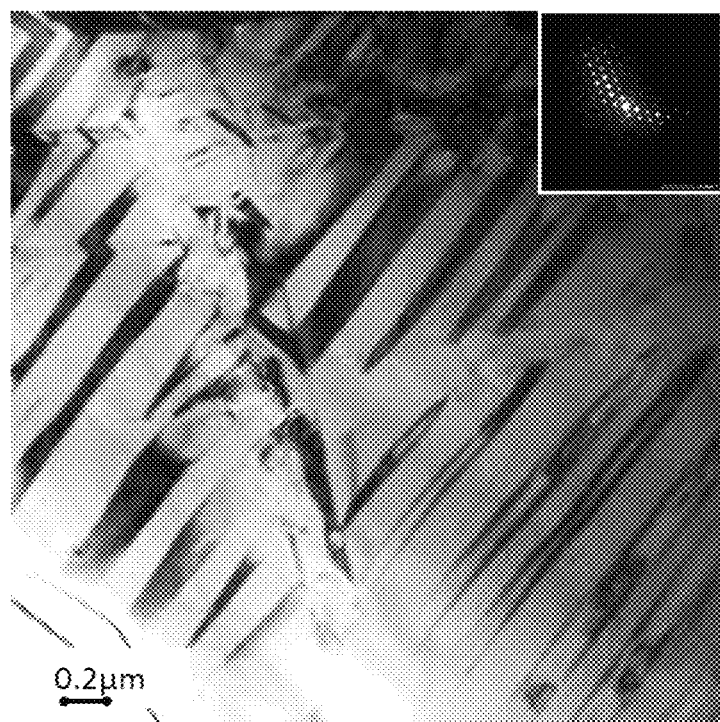
FIG. 6 is a TEM image of the compound of Example 1.

A transmission electron microscope photograph of the compound of Example 1 is shown in FIG. 6. A plurality of striped crystal domains were observed, and crystal domains having widths of 0.02 μm to 0.2 μm and lengths of at least 0.2 μm were observed.

(Thermoelectric Conversion Characteristics)

Figure 7:
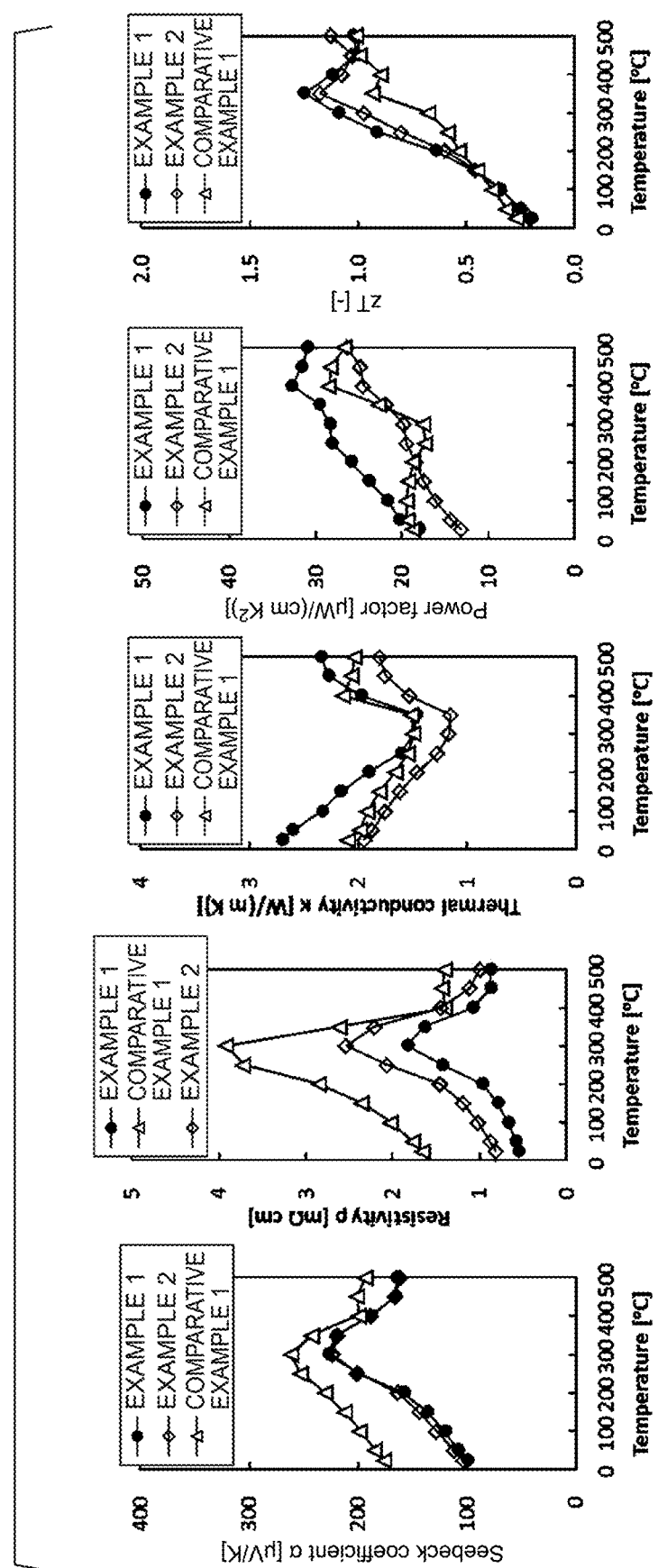
FIG. 7 is a series of diagrams illustrating various thermoelectric conversion property values relative to temperature for Examples 1 and 2 and Comparative Example 1.

The temperature dependence of thermoelectric conversion properties of the compound of Example 1 is shown in FIG. 7. Thermoelectric conversion characteristics of the compound of Example 1 including the carrier density at 300 K, the power factor and zT are shown in Table 2.

Example 2

A compound of Example 2 was obtained via an air cooling step (1) and a discharge plasma sintering step (2).

(1) Air Cooling Step

Using the same raw materials as Example 1, the raw materials were weighed to achieve a composition of $Ge_{0.92}Bi_{0.04}Cu_{0.04}Te$, and a mixture was obtained using an agate mortar. Subsequently, 3.5 g of the mixture was placed in a quartz ampule having the same shape as that used in Example 1, and the ampule was sealed under reduced pressure of $3 \times 10^{-4}$ Pa or lower. The quartz ampule was then heated to 950° C. in an electric furnace, and the mixture was melted. In the air cooling step, the quartz ampule was removed from the 950° C. electric furnace and cooled in the air. Cooling from 950° C. to 100° C. or lower took 4 hours. After cooling to room temperature, the ingot was recovered from the quartz ampule.

(2) Discharge Plasma Sintering Step

With the exception of using the ingot of Example 2, the same discharge plasma sintering step as Example 1 was performed, thus obtaining a compound.

The composition, production method, and material properties of the compound of Example 2 are shown in Table 1.

(Crystal Structure Analysis)

Figure 2B:
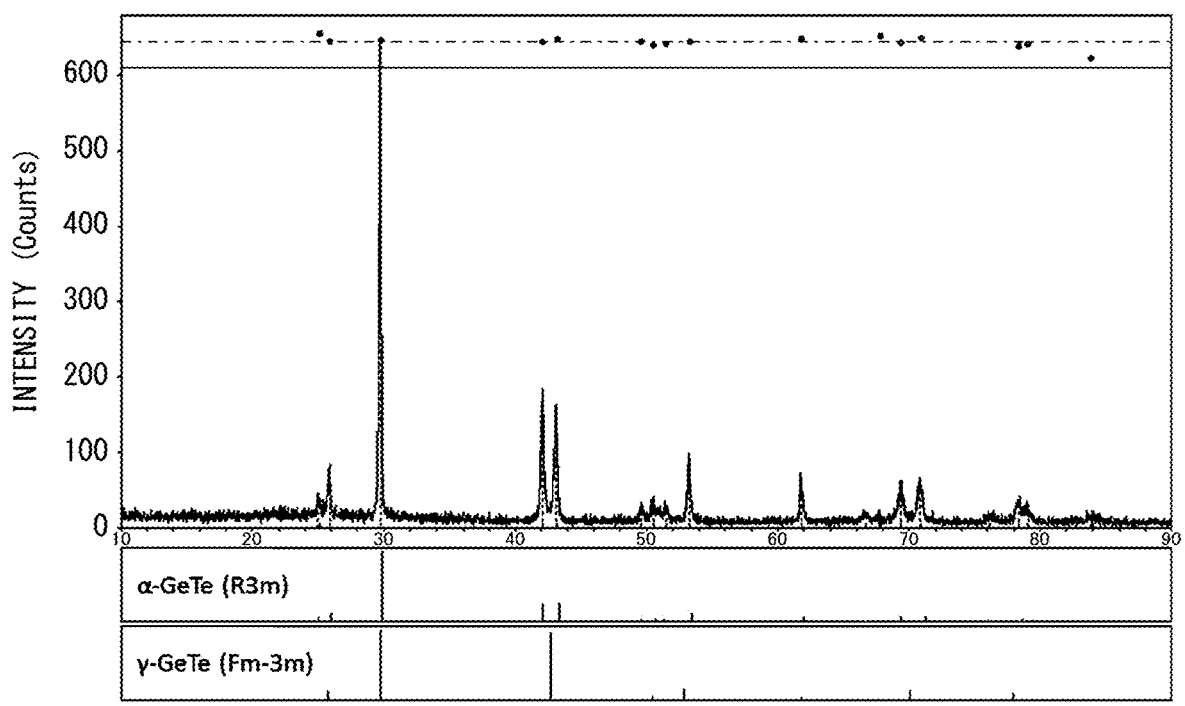
FIG. 2B is the powder X-ray diffraction pattern of the compound of Example 2.

A powder X-ray diffraction pattern for the compound of Example 2 is shown in FIG. 2B. Only peaks attributable to α-GeTe belonging to the R3m space group were observed. No peaks attributable to germanium metal were observed.

(Composition Segregation)

Figure 4B:
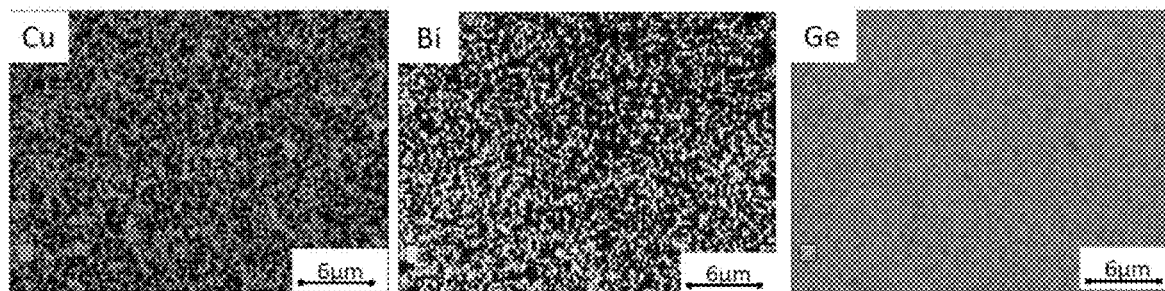
FIG. 4B is a diagram illustrating the composition distribution of the compound of Example 2.

The composition distribution of the compound of Example 2 is shown in FIG. 4B. The longest axis of copper segregation was 1.1 μm, and the longest axis of bismuth segregation was 0.7 μm.

(Thermoelectric Conversion Characteristics)

The temperature dependence of thermoelectric conversion properties of the thermoelectric conversion material of Example 2 is shown in FIG. 7. Thermoelectric conversion characteristics of the thermoelectric conversion material of Example 2 including the carrier density at 300 K, the power factor and zT are shown in Table 2.

Comparative Example 1

A compound of Comparative Example 1 was obtained via an air cooling step (1) and an annealing step (2).

(1) Air Cooling Step

Using the same raw materials as Example 1, the raw materials were weighed to achieve a composition of $Ge_{0.92}Bi_{0.04}Cu_{0.04}Te$, and a mixture was obtained using an agate mortar. The same air cooling step as Example 2 was then performed to obtain an ingot.

(2) Annealing Step

The ingot was heated to 550° C. inside a tube furnace under an argon atmosphere, and held at that temperature for 100 hours.

Subsequently, the ingot was cooled by turning off the tube furnace, and the compound was recovered.

The composition, production method, and material properties of the compound of Comparative Example 1 are shown in Table 1.

(Crystal Structure Analysis)

Figure 2C:
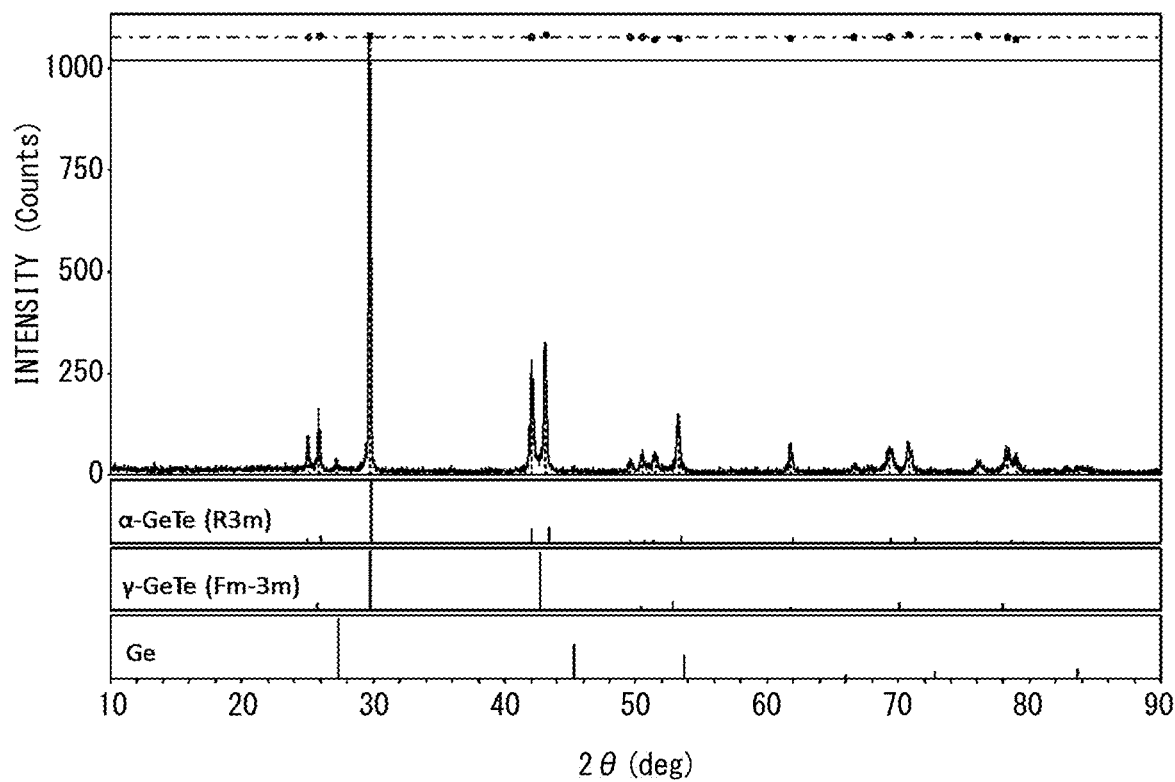
FIG. 2C is the powder X-ray diffraction pattern of the compound of Comparative Example 1.

A powder X-ray diffraction pattern for the compound of Comparative Example 1 is shown in FIG. 2C. Peaks attributable to α-GeTe belonging to the R3m space group and peaks attributable to germanium metal were observed. The maximum peak for α-GeTe was observed at 2θ=29.74°

(equivalent to a lattice constant of 0.3002 nm), and the maximum peak for germanium metal was observed at 2θ=27.21° (equivalent to a lattice constant of 0.3275 nm). The ratio I(Ge)/I(GeTe) between the maximum intensity I(GeTe) of the α-GeTe peak and the maximum intensity I(Ge) of the germanium metal peak was 0.027.
(Composition Segregation)

Figure 4C:
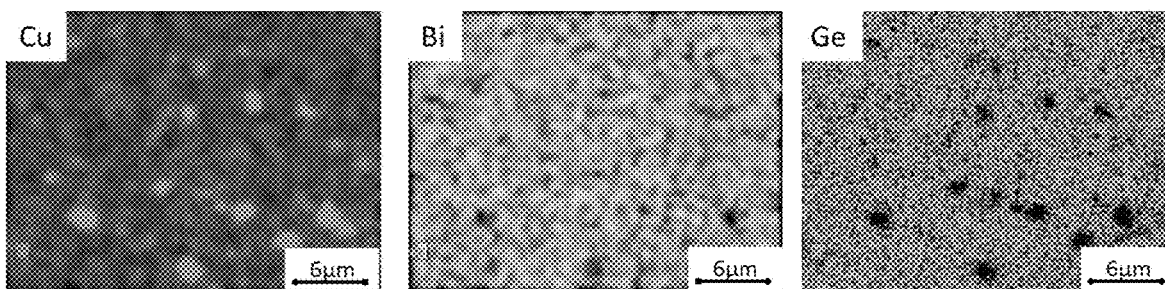
FIG. 4C is a diagram illustrating the composition distribution of the compound of Comparative Example 1.

The composition distribution of the compound of Comparative Example 1 is shown in FIG. 4C. The longest axis of copper segregation was 2.0 μm, and the longest axis of bismuth segregation was 2.0 μm. In the portions in which copper segregation occurred, bismuth and germanium were absent.
(Thermoelectric Conversion Characteristics)

The temperature dependence of thermoelectric conversion properties of the compound of Comparative Example 1 is shown in FIG. 7. Thermoelectric conversion characteristics of the compound of Comparative Example 1 including the carrier density at 300 K, the power factor and zT are shown in Table 2.

The compositions, production methods and material properties for the compounds of Example 1, Example 2 and Comparative Example 1 are summarized in Table 1. Thermoelectric conversion characteristics of the compounds of Example 1, Example 2 and Comparative Example 1, including the carrier density at 300 K, the power factor and zT, are summarized in Table 2.

Compared with Comparative Example 1, the compound of Example 1 had a higher power factor in a range from 50° C. to 500° C., and a higher zT value in a range from 150° C. to 500° C. in the compound obtained by performing the quenching step and the discharge plasma sintering step of Example 1, almost no crystal precipitation of germanium metal was observed, the segregation of bismuth and copper was minor, and superior thermoelectric conversion properties were realized.

Compared with Comparative Example 1, the compound of Example 2 had a higher zT value in a range from 200° C. to 500° C. In the compound obtained by performing the discharge plasma sintering step of Example 2, almost no crystal precipitation of germanium metal was observed, the segregation of bismuth and copper was minor, and superior thermoelectric conversion properties were realized.

Compared with Example 2, the compound of Example 1 had a higher power factor in a range from 50° C. to 500° C., and a higher zT value in a range from 200° C. to 350° C. The compound obtained by performing both the quenching step and the discharge plasma sintering step of Example 1 exhibited superior thermoelectric conversion properties to the compound obtained by performing only the discharge plasma sintering step of Example 2.

Example 3

In a similar manner to Example 1, a compound of Example 3 was obtained via a quenching step (1) and a discharge plasma sintering step (2).
(1) Quenching Step With the exception of placing 2.5 g of a mixture having a composition of $Ge_{0.95}Bi_{0.05}Cu_{0.03}Te$ into a quartz ampule (inner diameter: 5 mm, outer diameter: 6 mm), the same quenching step as Example 1 was performed, thus obtaining an ingot.
(2) Discharge Plasma Sintering Step With the exception of using the ingot of Example 3, the same discharge plasma sintering step as Example 1 was performed, thus obtaining a compound.

The composition, production method, and material properties of the compound of Example 3 are shown in Table 1.
(Crystal Structure Analysis)

Figure 3A:
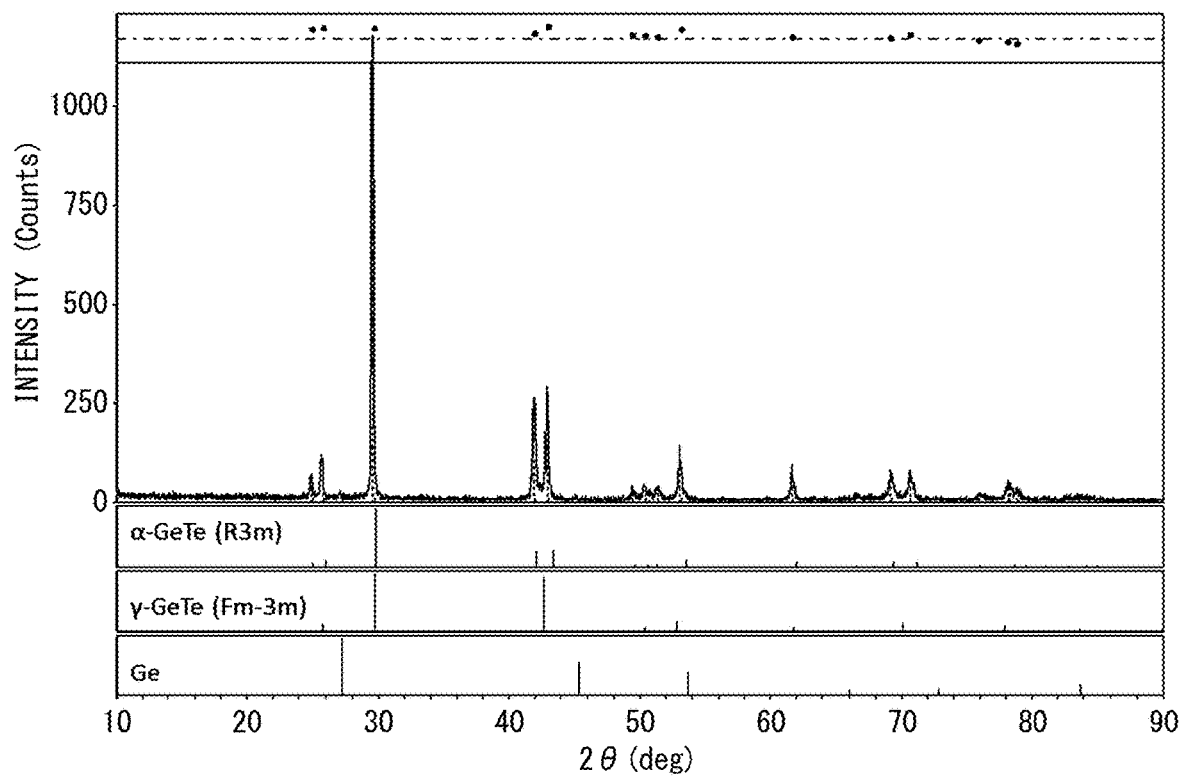
FIG. 3A is the powder X-ray diffraction pattern of the compound of Example 4.
Figure 3B:
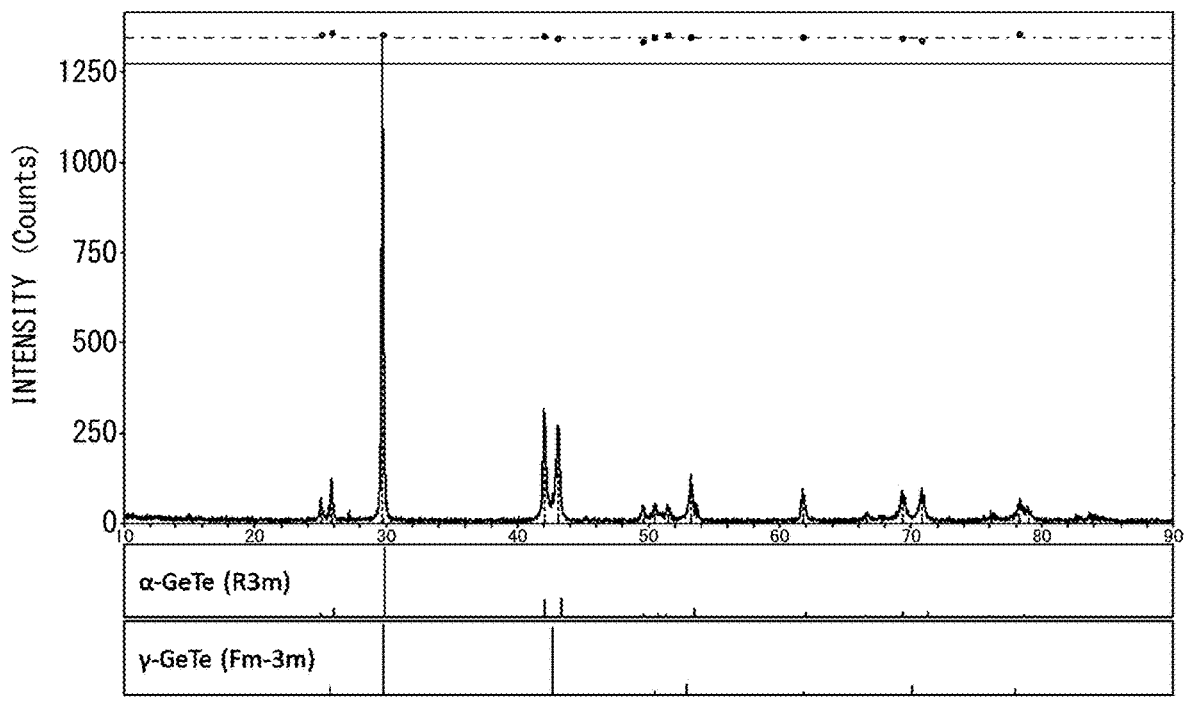
FIG. 3B is the powder X-ray diffraction pattern of the compound of Example 3.

A powder X-ray diffraction pattern for the compound of Example 3 is shown in FIG. 3B. Only peaks attributable to α-GeTe belonging to the R3m space group were observed. No peaks attributable to germanium metal were observed.
(Composition Segregation)

Figure 5A:
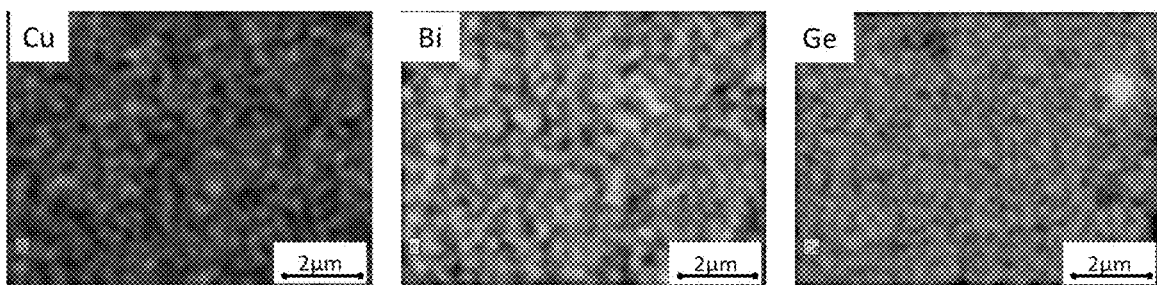
FIG. 5A is a diagram illustrating the composition distribution of the compound of Example 3.

The composition distribution of the compound of Example 3 is shown in FIG. 5A. The longest axis of copper segregation was 0.4 μm, and the longest axis of bismuth segregation was 0.4 μm.
(Thermoelectric Conversion Characteristics)

Figure 8:
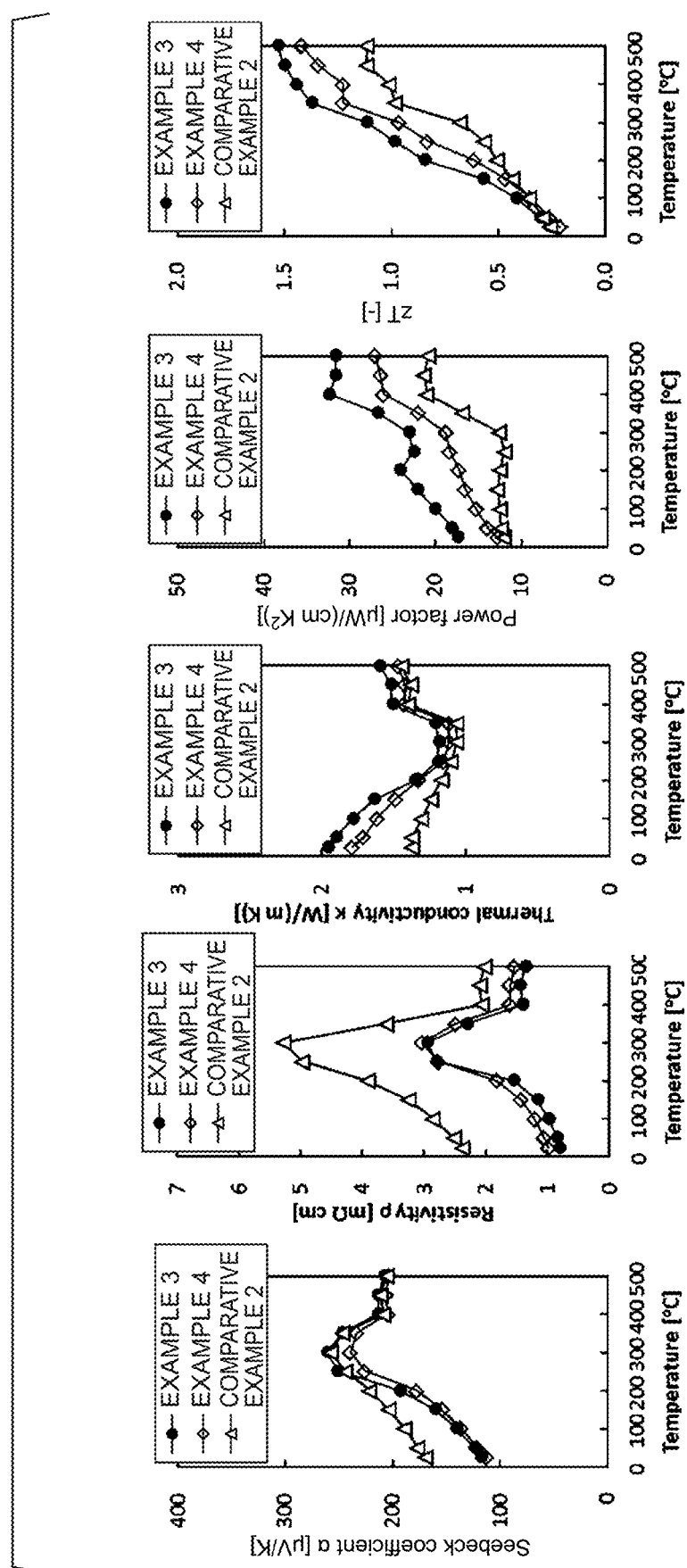
FIG. 8 is a series of diagrams illustrating various thermoelectric conversion property values relative to temperature for Examples 3 and 4 and Comparative Example 2.

The temperature dependence of thermoelectric conversion properties of the compound of Example 3 is shown in FIG. 8. Thermoelectric conversion characteristics of the compound of Example 3 including the carrier density at 300 K, the power factor and zT are shown in Table 2.

Example 4

In a similar manner to Example 2, a compound of Example 4 was obtained via an air cooling step (1) and a discharge plasma sintering step (2).
(1) Air Cooling Step With the exceptions of using the same $Ge_{0.95}Bi_{0.05}Cu_{0.03}Te$ composition as Example 3, and placing 2.5 g of the mixture in a quartz ampule (inner diameter: 5 mm, outer diameter: 6 mm), the same air cooling step as Example 2 was performed, thus obtaining an ingot.
(2) Discharge Plasma Sintering Step With the exception of using the ingot of Example 4, the same discharge plasma sintering step as Example 1 was performed, thus obtaining a compound.

The composition, production method, and material properties of the compound of Example 4 are shown in Table 1.
(Crystal Structure Analysis)

A powder X-ray diffraction pattern for the compound of Example 4 is shown in FIG. 3A. Peaks attributable to α-GeTe belonging to the R3m space group and peaks attributable to germanium metal were observed. The maximum peak for α-GeTe was observed at 2θ=29.72° (equivalent to a lattice constant of 0.3003 nm), and the maximum peak for germanium metal was observed at 2θ=27.24° (equivalent to a lattice constant of 0.3272 nm). The ratio I(Ge)/I(GeTe) between the maximum intensity I(GeTe) of the α-GeTe peak and the maximum intensity I(Ge) of the germanium metal peak was 0.022.
(Composition Segregation)

Figure 5B:
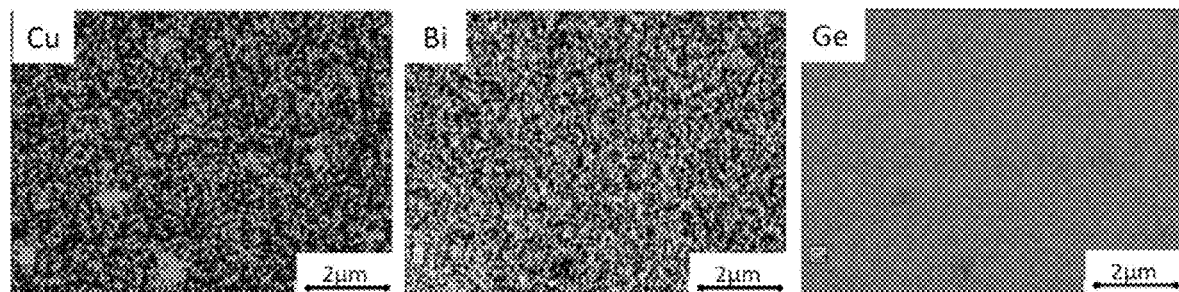
FIG. 5B is a diagram illustrating the composition distribution of the compound of Example 4.

The composition distribution of the compound of Example 4 is shown in FIG. 5B. The longest axis of copper segregation was 0.6 μm, and the longest axis of bismuth segregation was 0.2 μm.
(Thermoelectric Conversion Characteristics)

The temperature dependence of thermoelectric conversion properties of the compound of Example 4 is shown in FIG. 8. Thermoelectric conversion characteristics of the compound of Example 4 including the carrier density at 300 K, the power factor and zT are shown in Table 2.

Comparative Example 2

In a similar manner to Comparative Example 1, a compound of Comparative Example 2 was obtained via an air cooling step (1) and an annealing step (2).

(1) Air Cooling Step

With the exceptions of using the same $Ge_{0.95}Bi_{0.05}Cu_{0.03}Te$ composition as Example 3, and placing 2.5 g of the mixture in a quartz ampule (inner diameter: 5 mm, outer diameter: 6 mm), the same air cooling step as Comparative Example 1 was performed, thus obtaining an ingot.

(2) Annealing Step

With the exception of using the ingot of Comparative Example 2, the same annealing step as Comparative Example 1 was performed, thus obtaining a thermoelectric conversion material.

The composition, production method, and material properties of the compound of Comparative Example 2 are shown in Table 1.

(Crystal Structure Analysis)

Figure 3C:
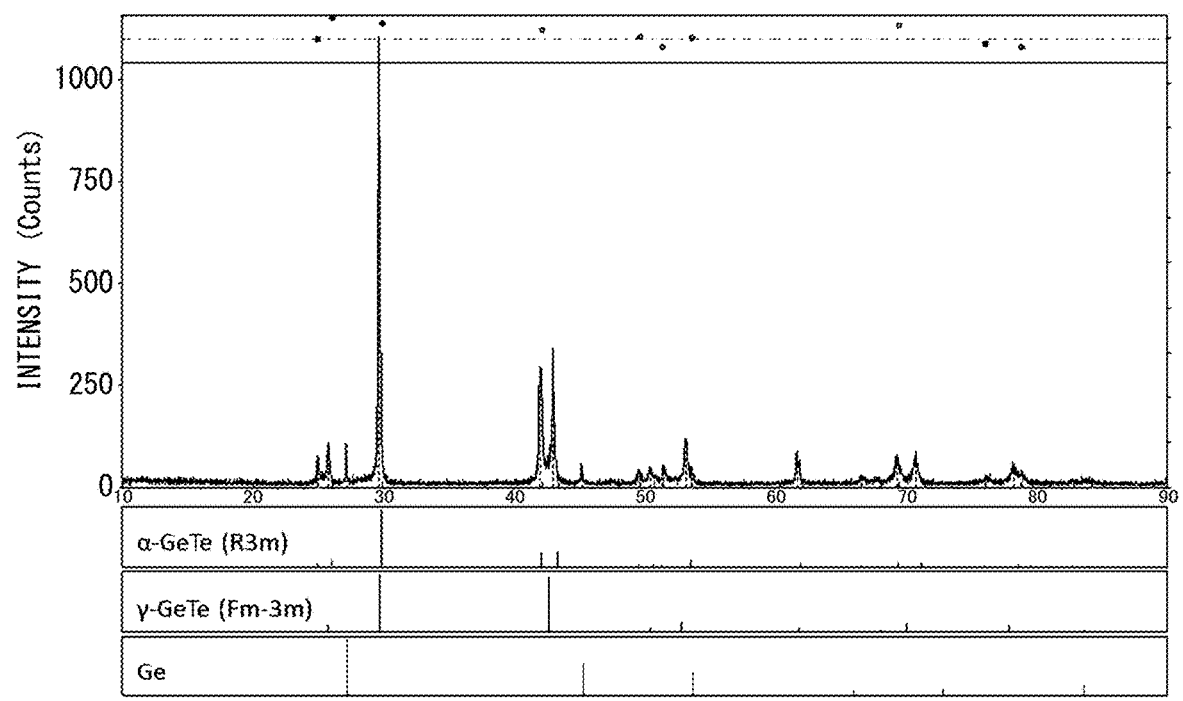
FIG. 3C is the powder X-ray diffraction pattern of the compound of Comparative Example 2.

A powder X-ray diffraction pattern for the compound of Comparative Example 2 is shown in FIG. 3C. Peaks attributable to α-GeTe belonging to the R3m space group and peaks attributable to germanium metal were observed. The maximum peak for α-GeTe was observed at 2θ=29.70° (equivalent to a lattice constant of 0.3006 nm), and the maximum peak for germanium metal was observed at 2θ=27.22° (equivalent to a lattice constant of 0.3274 nm). The ratio I(Ge)/(GeTe) between the maximum intensity I(GeTe) of the α-GeTe peak and the maximum intensity I(Ge) of the germanium metal peak was 0.087.

(Composition Segregation)

Figure 5C:
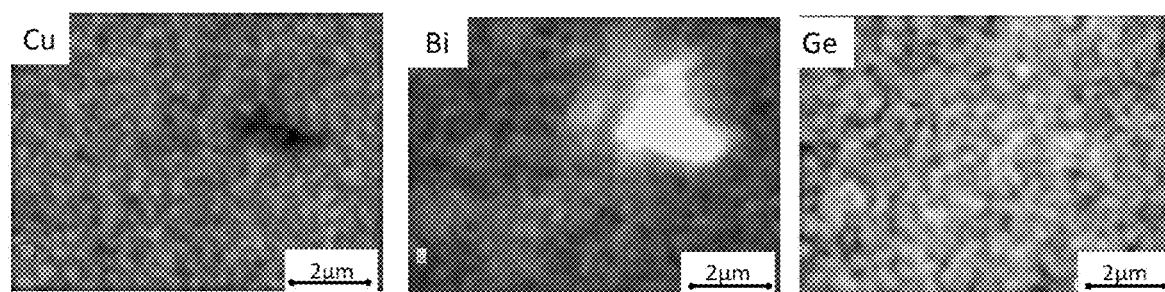
FIG. 5C is a diagram illustrating the composition distribution of the compound of Comparative Example 2.
Figure 5D:
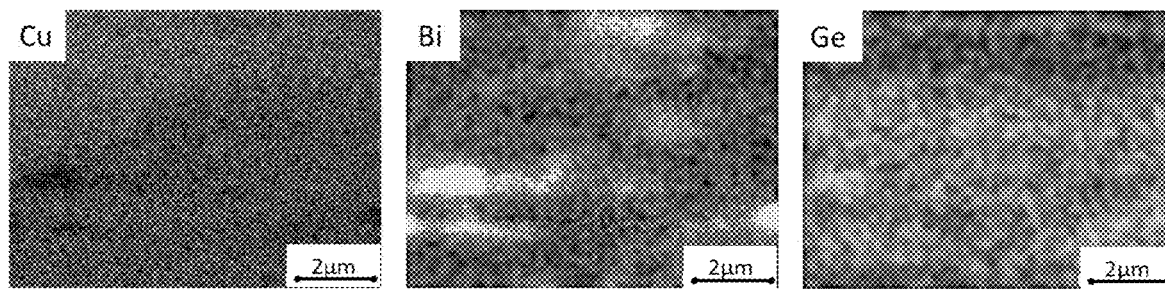
FIG. 5D is a diagram illustrating the composition distribution of the compound of Comparative Example 2.

The composition distribution of the compound of Comparative Example 2 is shown in FIG. 5C and FIG. 5D. The longest axis of copper segregation was 0.5 μm, and the longest axis of bismuth segregation was 2.0 μm. In the portions in which bismuth segregation occurred, copper was absent.

(Thermoelectric Conversion Characteristics)

The temperature dependence of thermoelectric conversion properties of the compound of Comparative Example 2 is shown in FIG. 8. Thermoelectric conversion characteristics of the compound of Comparative Example 2 including the carrier density at 300 K, the power factor and zT are shown in Table 2.

The compositions, production methods and material properties for the compounds of Example 3, Example 4 and Comparative Example 2 are summarized in Table 1. Thermoelectric conversion characteristics of the compounds of Example 3, Example 4 and Comparative Example 2, including the carrier density at 300 K, the power factor and zT, are summarized in Table 2.

Compared with Comparative Example 2, the compound of Example 3 had a higher power factor in a range from 50° C. to 500° C., and a higher zT value in a range from 100° C. to 500° C. In the compound obtained by performing the quenching step and the discharge plasma sintering step of Example 3, almost no crystal precipitation of germanium metal was observed, the segregation of bismuth and copper was minor, and superior thermoelectric conversion properties were realized.

Compared with Comparative Example 2, the compound of Example 4 had a higher power factor in a range from 50° C. to 500° C., and a higher zT value within a range from 150° C. to 500° C. In the compound obtained by performing the discharge plasma sintering step of Example 4, the maximum intensity of peaks attributable to germanium metal in the powder X-ray diffraction pattern was small, the segregation of bismuth and copper was minor, and superior thermoelectric conversion properties were realized.

Compared with Example 4, the compound of Example 3 had a higher power factor within a range from 50° C. to 500° C., and a higher zT value in a range from 50° C. to 500° C. The compound obtained by performing both the quenching step and the discharge plasma sintering step of Example 3 exhibited superior thermoelectric conversion properties to the compound obtained by performing only the discharge plasma sintering step of Example 4.

Examples 5 to 9

With the exception of using the compositions shown in Table 1, compounds of Examples 5 to 9 were obtained by performing the same quenching step (1) and discharge plasma sintering step (2) as Example 3.

The material properties of the compounds obtained in Examples 5 to 9 are shown in Table 1.

(Crystal Structure Analysis)

When the crystal structures of the compounds obtained in Examples 5 to 9 were analyzed, peaks attributable to α-GeTe belonging to the R3m space group were observed in each case. In all of the compounds of Examples 5 to 9, the value of I(Ge)/I(GeTe) was 0.025 or less.

(Composition Segregation)

In each of the compounds obtained in Examples 5 to 9, the longest axis of copper segregation was less than 2.0 μm, and the longest axis of bismuth segregation was less than 2.0 μm.

(Thermoelectric Conversion Characteristics)

Figure 9:
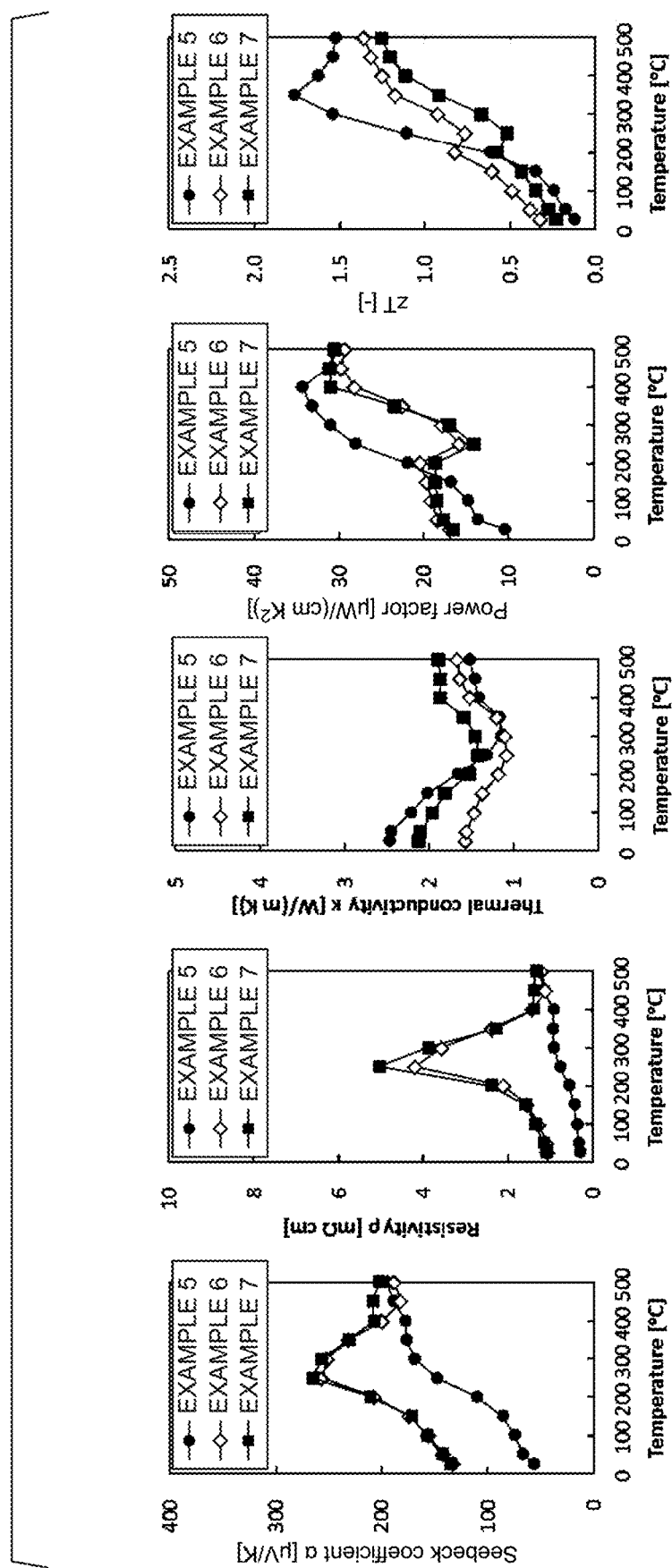
FIG. 9 is a series of diagrams illustrating various thermoelectric conversion property values relative to temperature for Examples 5 to 7.

The temperature dependence of thermoelectric conversion properties of each of the compounds obtained in Examples 5 to 7 is shown in FIG. 9.

Figure 10:
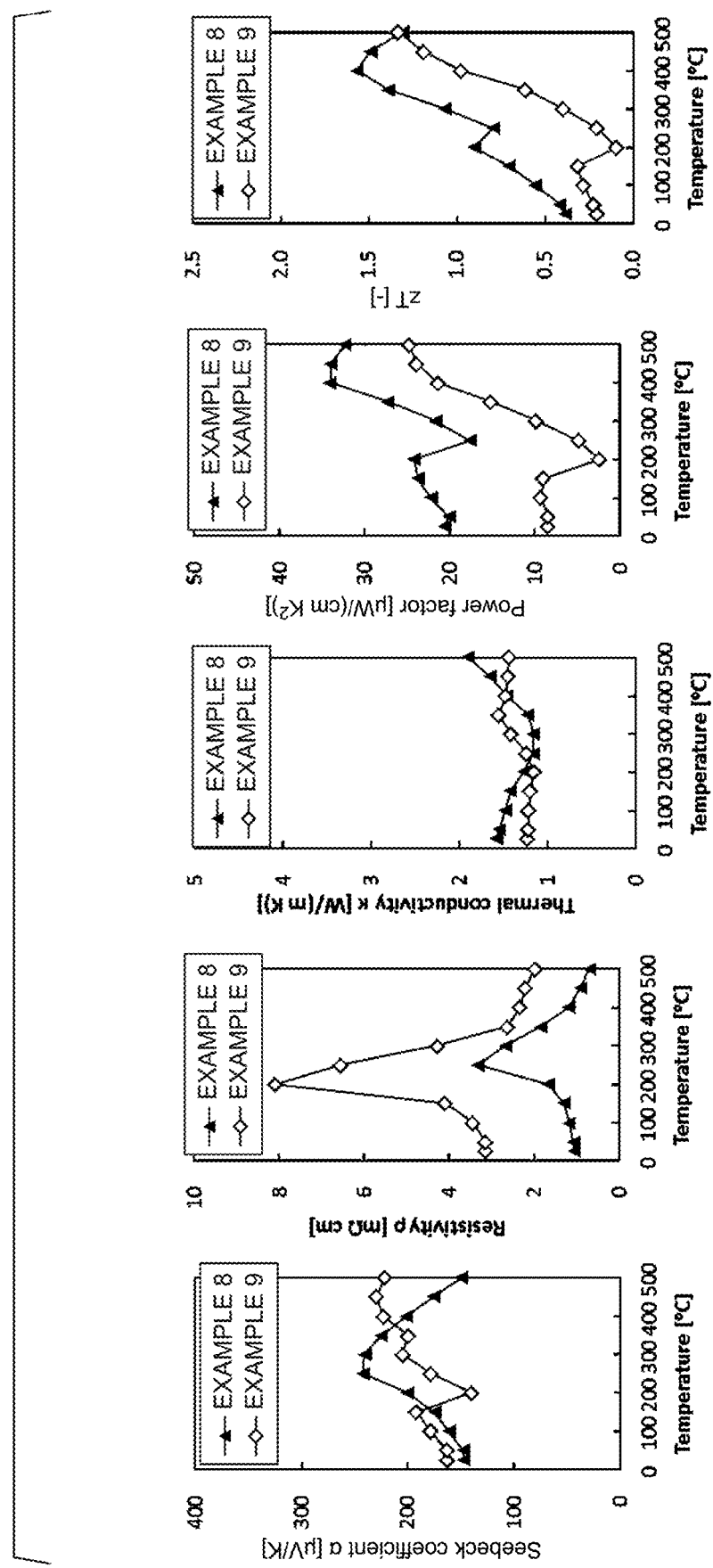
FIG. 10 is a series of diagrams illustrating various thermoelectric conversion property values relative to temperature for Examples 8 and 9.

The temperature dependence of thermoelectric conversion properties of each of the compounds obtained in Examples 8 and 9 is shown in FIG. 10. Thermoelectric conversion characteristics of the compounds of Examples 5 to 9, including the carrier density at 300 K, the power factor and zT, are summarized in Table 2.

For the compound of Example 5, the power factor was higher than that of Comparative Examples 1 and 2 in a range from 200° C. to 500° C., and the zT value was higher than that of Comparative Examples 1 and 2 in a range from 200° C. to 500° C.

For the compound of Example 6, the power factor was higher than that of Comparative Examples 1 and 2 in a range from 150° C. to 500° C. (but excluding the range from 350° C. to 450° C.), and the zT value was higher than that of Comparative Examples 1 and 2 in a range from 25° C. to 500° C.

For the compound of Example 7, the power factor was higher than that of Comparative Examples 1 and 2 in a range from 350° C. to 500° C., and the zT value was higher than that of Comparative Examples 1 and 2 in a range from 200° C. to 500° C. (but excluding the range from 300° C. to 350° C.).

For the compound of Example 8, the power factor was higher than that of Comparative Examples 1 and 2 in a range from 25° C. to 500° C., and the zT value was higher than that of Comparative Examples 1 and 2 in a range from 25° C. to 500° C.

For the compound of Example 9, the zT value was higher than that of Comparative Examples 1 and 2 in a range from 450° C. to 500° C.

TABLE 1

| No. | $Ge_{1+a-b-c}Bi_bCu_cTe$ a | b | c | Cooling step | Sintering step | Crystal structure | Powder X-ray diffraction Peak intensity ratio I(Ge)/I(GeTe) | Composition segregation [μm] Cu | Bi |
|---|---|---|---|---|---|---|---|---|---|
| Example 1 | 0 | 0.04 | 0.04 | quenching | plasma discharge | R3m | Ge not detected | 0.4 | 0.3 |
| Example 2 | 0 | 0.04 | 0.04 | air cooling | plasma discharge | R3m | Ge not detected | 1.1 | 0.7 |
| Comparative Example 1 | 0 | 0.04 | 0.04 | air cooling | annealing | R3m | 0.027 | 2.0 | 2.0 |
| Example 3 | 0.03 | 0.05 | 0.03 | quenching | plasma discharge | R3m | Ge not detected | 0.4 | 0.4 |
| Example 4 | 0.03 | 0.05 | 0.03 | air cooling | plasma discharge | R3m | 0.022 | 0.6 | 0.2 |
| Comparative Example 2 | 0.03 | 0.05 | 0.03 | air cooling | annealing | R3m | 0.087 | 0.5 | 2.0 |
| Example 5 | 0 | 0.05 | 0.02 | quenching | plasma discharge | R3m | 0.013 | 0.8 | 0.8 |
| Example 6 | 0 | 0.05 | 0.05 | quenching | Plasma discharge | R3m | Ge not detected | 0.9 | 0.6 |
| Example 7 | 0.05 | 0.05 | 0.05 | quenching | plasma discharge | R3m | 0.023 | 1.2 | 0.5 |
| Example 8 | 0 | 0.05 | 0.10 | quenching | plasma discharge | R3m | Ge not detected | 1.0 | 0.3 |
| Example 9 | 0.05 | 0.10 | 0.10 | quenching | plasma discharge | R3m | 0.021 | 0.9 | 0.5 |

TABLE 2

| No. | Carrier density [$10^{20}$ cm$^{-3}$] | Power factor [μW/(cmK$^2$)] 200° C. | 300° C. | 400° C. | 500° C. | zT [—] 200° C. | 300° C. | 400° C. | 500° C. |
|---|---|---|---|---|---|---|---|---|---|
| Example 1 | 2.7 | 26 | 28 | 33 | 31 | 0.64 | 1.09 | 1.12 | 1.02 |
| Example 2 | 1.4 | 18 | 20 | 24 | 26 | 0.60 | 0.97 | 1.07 | 1.13 |
| Comparative Example 1 | 0.53 | 19 | 18 | 28 | 27 | 0.53 | 0.67 | 0.89 | 1.01 |
| Example 3 | 1.5 | 24 | 23 | 32 | 32 | 0.85 | 1.12 | 1.45 | 1.53 |
| Example 4 | 0.83 | 17 | 19 | 26 | 27 | 0.61 | 0.97 | 1.23 | 1.42 |
| Comparative Example 2 | 0.46 | 13 | 13 | 21 | 21 | 0.51 | 0.68 | 1.01 | 1.12 |
| Example 5 | 1.1 | 22 | 31 | 34 | 30 | 0.62 | 1.55 | 1.63 | 1.53 |
| Example 6 | 0.85 | 20 | 18 | 28 | 29 | 0.82 | 0.92 | 1.25 | 1.36 |
| Example 7 | 0.72 | 19 | 17 | 31 | 31 | 0.58 | 0.67 | 1.11 | 1.25 |
| Example 8 | 0.90 | 24 | 22 | 34 | 32 | 0.90 | 1.07 | 1.57 | 1.31 |
| Example 9 | 0.58 | 2 | 10 | 21 | 25 | 0.10 | 0.40 | 0.98 | 1.34 |

Examples 10 to 12

With the exception of using the compositions shown in Table 3, compounds of Examples 10 to 12 were obtained by performing the same quenching step (1) and discharge plasma sintering step (2) as Example 3.

The material properties of the compounds obtained in Examples 10 to 12 are shown in Table 3, together with the material properties of Example 3 and Comparative Example 2.

(Crystal Structure Analysis)

When the crystal structures of the compounds obtained in Examples 10 to 12 were analyzed, peaks attributable to α-GeTe belonging to the R3m space group were observed in each case. In all of the compounds of Examples 10 to 12, the value of I(Ge)/I(GeTe) was 0.025 or less.

(Composition Segregation)

In each of the compounds obtained in Examples 10 to 12, the longest axis of copper segregation was less than 2.0 μm, and the longest axis of bismuth segregation was less than 2.0 μm.

(Thermoelectric Conversion Characteristics)

Figure 11:
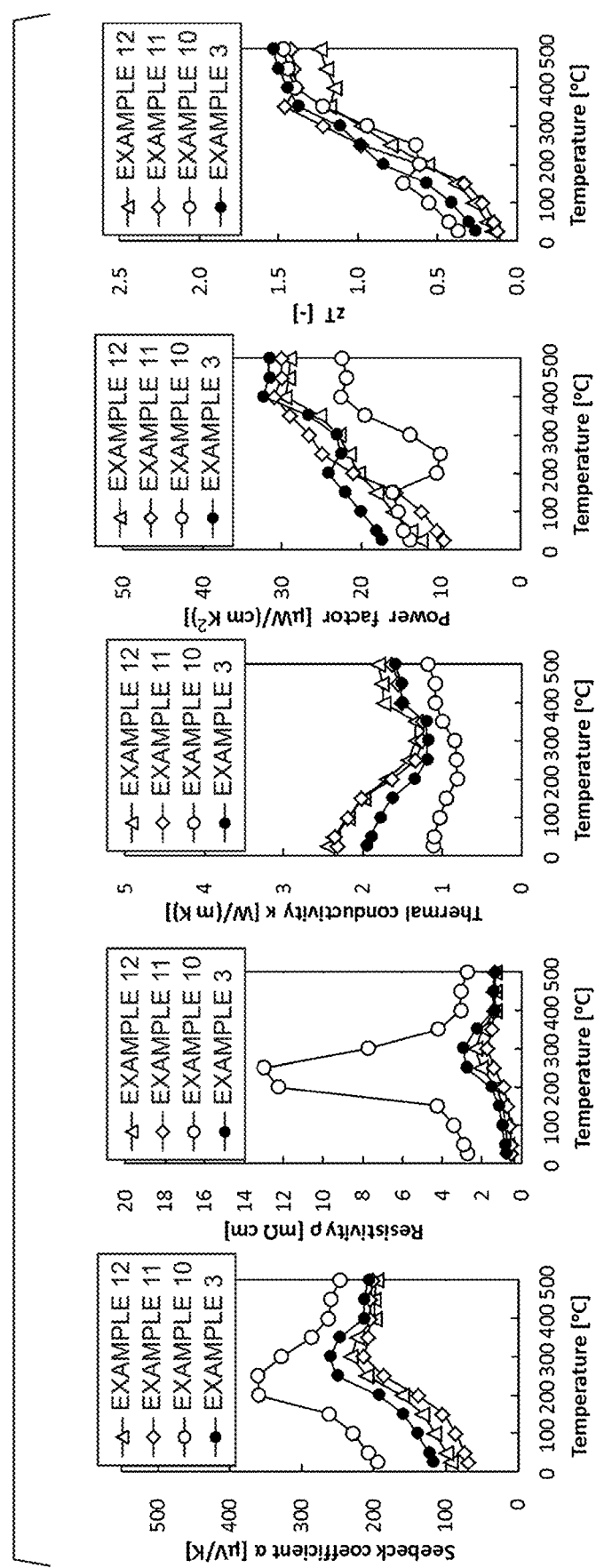
FIG. 11 is a series of diagrams illustrating various thermoelectric conversion property values relative to temperature for Example 3 together with Examples 10 to 12.

The temperature dependence of thermoelectric conversion properties of each of the compounds obtained in Examples 10 to 12 is shown in FIG. 11, together with the results for Example 3. Thermoelectric conversion characteristics of the compounds obtained in Examples 10 to 12, including the carrier density at 300 K, the power factor and zT, are summarized in Table 4.

TABLE 3

| No. | Added element | Composition | Cooling step | Sintering step | Crystal structure | Powder X-ray diffraction Peak intensity ratio I(Ge)/I(GeTe) | Segregation [μm] Cu | Segregation [μm] Bi |
|---|---|---|---|---|---|---|---|---|
| Comparative Example 2 | — | $Ge_{0.95}Bi_{0.05}Cu_{0.03}Te$ | air cooling | annealing | R3m | 0.087 | 0.5 | 2.0 |
| Example 3 | — | $Ge_{0.95}Bi_{0.05}Cu_{0.03}Te$ | quenching | plasma discharge | R3m | Ge not detected | 0.4 | 0.4 |
| Example 10 | Pb | $Ge_{0.85}Pb_{0.10}Bi_{0.05}Cu_{0.03}Te$ | quenching | plasma discharge | R3m | 0.020 | 0.3 | 0.2 |
| Example 11 | Ag | $Ge_{0.95}Bi_{0.05}Cu_{0.015}Ag_{0.015}Te$ | quenching | plasma discharge | R3m | Ge not detected | 0.3 | 0.2 |
| Example 12 | Sb | $Ge_{0.95}Bi_{0.025}Sb_{0.025}Cu_{0.03}Te$ | quenching | plasma discharge | R3m | 0.025 | 1.1 | 1.1 |

TABLE 4

| No. | Carrier density [$10^{20}$ cm$^{-3}$] | Power factor [μW/(cmK$^2$)] 200° C. | 300° C. | 400° C. | 500° C. | zT [—] 200° C. | 300° C. | 400° C. | 500° C. |
|---|---|---|---|---|---|---|---|---|---|
| Comparative Example 2 | 0.46 | 13 | 13 | 21 | 21 | 0.51 | 0.68 | 1.01 | 1.12 |
| Example 3 | 1.5 | 24 | 23 | 32 | 32 | 0.85 | 1.12 | 1.45 | 1.53 |
| Example 10 | 0.43 | 11 | 14 | 23 | 22 | 0.61 | 0.94 | 1.40 | 1.47 |
| Example 11 | 3.1 | 21 | 26 | 31 | 30 | 0.61 | 1.22 | 1.38 | 1.42 |
| Example 12 | 1.7 | 20 | 23 | 30 | 29 | 0.56 | 0.98 | 1.14 | 1.24 |

The compound of Example 10 was prepared by substituting a portion of the germanium in the compound of Example 3 with lead, and had a composition of $Ge_{0.85}Pb_{0.10}Bi_{0.05}Cu_{0.03}Te$. Compared with Example 3, the thermoelectromotive force (the Seebeck coefficient) of the compound of Example 10 was higher from room temperature to 500° C., whereas compared with Example 3, the thermal conductivity of the compound of Example 10 was lower from room temperature to 500° C. The zT value for the compound of Example 10 was higher than that of Comparative Example 2, and in particular, compared with Example 3, the zT value for the compound of Example 10 was higher from room temperature to 150° C. At 400° C. or higher, the value of zT was 1.4 or greater, a similar value to that of Example 3.

By producing a compound which contained added lead in addition to the constituent elements of germanium, tellurium, bismuth and copper, the thermoelectromotive force (the Seebeck coefficient) was increased and the thermal conductivity was reduced. Moreover, an effect wherein the value of zT was increased, particularly in the comparatively low temperature range from temperatures near room temperature to temperatures near 150° C., was also obtained. Because a comparatively high zT value was able to be obtained at the low temperature side while maintaining a high zT value at high temperatures, a thermoelectric conversion device using the above compound as a thermoelectric conversion material is effective from the viewpoint of increasing the thermoelectric conversion efficiency across a broad temperature range.

Further, because the compound exhibits a high thermoelectromotive force and low thermal conductivity, a thermoelectric conversion device containing the above compound as a thermoelectric conversion material is effective in terms of obtaining a high voltage.

The compound of Example 11 was prepared by substituting a portion of the copper in the compound of Example 3 with silver, and had a composition of $Ge_{0.95}Bi_{0.05}Cu_{0.015}Ag_{0.015}Te$.

Compared with Example 3, the resistivity of the compound of Example 11 was lower from room temperature to 500° C., whereas compared with Example 3, the power factor of the compound of Example 11 was higher from 250 to 300° C., and was substantially the same at even higher temperatures. Compared with Example 3, the zT value for the compound of Example 11 was higher from 300 to 350° C., and at 500° C., the value of zT reached 1.4 or greater, a similar value to that of Example 3.

By producing a compound which contained added silver in addition to the constituent elements of germanium, tellurium, bismuth and copper, the carrier density was increased and the resistivity was reduced. Moreover, an effect wherein the power factor and zT were increased, particularly in range from temperatures near room temperature to temperatures near 300° C., was also obtained. Because a comparatively high power factor and zT value were able to be obtained at comparatively high temperatures near 300° C. while maintaining a high zT value at high temperatures, a thermoelectric conversion device using the above compound as a thermoelectric conversion material is effective from the viewpoint of increasing the thermoelectric conversion efficiency across a broad temperature range. Because the carrier density can be increased and the resistivity can be reduced, a thermoelectric conversion device containing the above compound as a thermoelectric conversion material is effective in terms of reducing the contact resistance between the thermoelectric conversion element and the electrodes.

The compound of Example 12 was prepared by substituting a portion of the bismuth in the compound of Example 3 with antimony, and had a composition of $Ge_{0.95}Bi_{0.025}Sb_{0.025}Cu_{0.03}Te$. Compared with the compound of Comparative Example 2, the power factor and zT values for the compound of Example 12 were higher within a range from room temperature to 500° C. However, the power factor and zT values for the compound of Example 12 did not increase as much as those of Example 3.

Examples 13 and 14>

With the exception of using the compositions shown in Table 5, compounds of Examples 13 and 14 were obtained by performing the same quenching step (1) and discharge plasma sintering step (2) as Example 3.

The material properties of the compounds obtained in Examples 13 and 14 are shown in Table 5, together with the material properties of Example 6.
(Crystal Structure Analysis)

When the crystal structures of the compounds obtained in Examples 13 and 14 were analyzed, peaks attributable to α-GeTe belonging to the R3m space group were observed in each case. In the compounds of Examples 13 and 14, no peaks attributable to germanium metal were detected.
(Composition Segregation)

In each of the compounds obtained in Examples 13 and 14, the longest axis of copper segregation was less than 2.0 μm, and the longest axis of bismuth segregation was less than 2.0 μm.
(Thermoelectric Conversion Characteristics)

Figure 12:
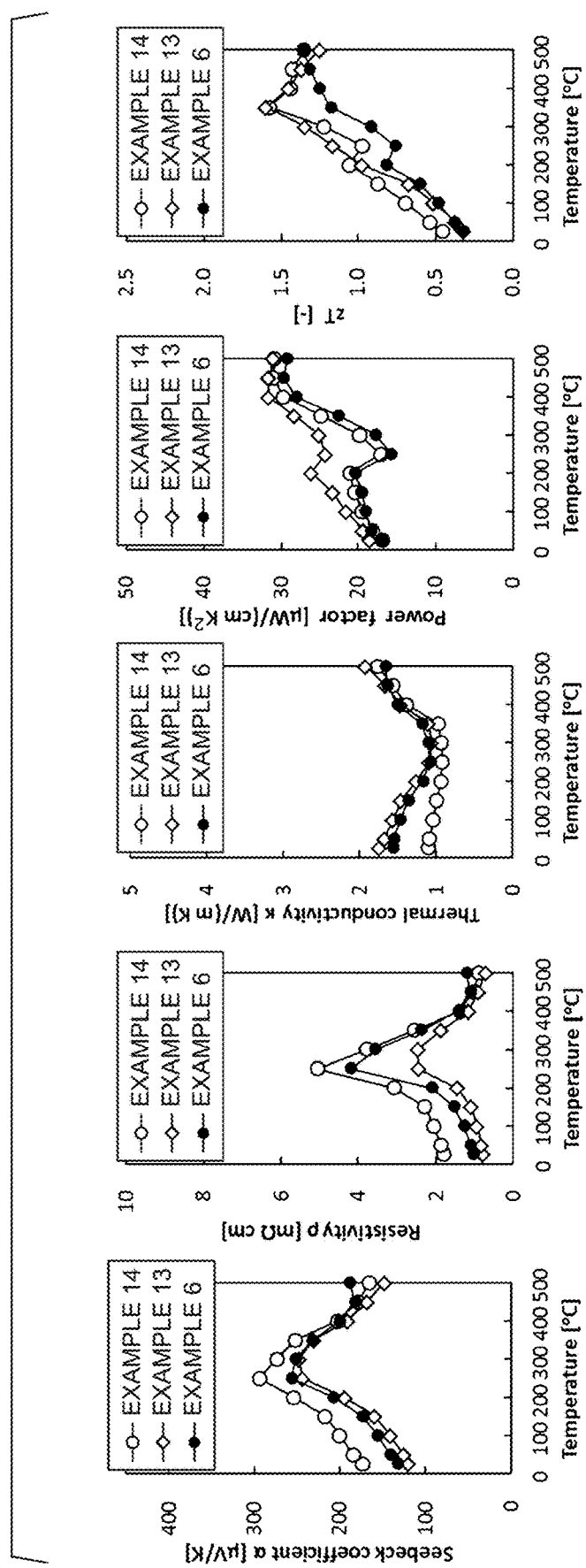
FIG. 12 is a series of diagrams illustrating various thermoelectric conversion property values relative to temperature for Example 6 together with Examples 13 and 14.

The temperature dependence of thermoelectric conversion properties of each of the compounds obtained in Examples 13 and 14 is shown in FIG. 12. Thermoelectric conversion characteristics of the compounds of Examples 13 and 14, including the carrier density at 300 K, the power factor and zT, are summarized in Table 6.

Compared with Example 6, the resistivity of the compound of Example 13 was lower from room temperature to 500° C., and compared with Example 6, the power factor of the compound of Example 13 was higher from room temperature to 500° C. Compared with Example 3, the zT value for the compound of Example 13 was equal or higher from room temperature to 400° C., and in particular, was markedly higher from 100 to 450° C.

By producing a compound which contained added selenium in a comparatively small amount in addition to the constituent elements of germanium, tellurium, bismuth and copper, the carrier density was increased and the resistivity was reduced. Moreover, the power factor from room temperature to 500° C. was increased, and an effect wherein the value of zT was markedly higher from 100 to 450° C. was also obtained.

Because the power factor and zT values were able to be increased across a broad temperature range, a thermoelectric conversion device containing the above compound as a thermoelectric conversion material is effective from the viewpoint of increasing the thermoelectric conversion efficiency across a broad temperature range. Because the carrier density can be increased and the resistivity can be reduced, a thermoelectric conversion device using the above compound as a thermoelectric conversion material is effective from the viewpoint of reducing the contact resistance between the thermoelectric conversion element and the electrodes.

The compound of Example 14 was prepared by substituting a portion of the tellurium in the compound of Example 6 with selenium, and had a composition of $Ge_{0.90}Bi_{0.05}Cu_{0.05}Te_{0.90}Se_{0.10}$.

Compared with Example 6, the thermoelectromotive force (the Seebeck coefficient) of the compound of Example 14 was higher within a range from room temperature to 500° C., whereas compared with Example 6, the thermal conduc-

TABLE 5

| No. | Added element | Composition | Cooling step | Sintering step | Crystal structure | Powder X-ray diffraction Peak intensity ratio I(Ge)/I(GeTe) | Segregation [μm] Cu | Bi |
|---|---|---|---|---|---|---|---|---|
| Example 6 | — | $Ge_{0.90}Bi_{0.05}Cu_{0.05}Te$ | quenching | plasma discharge | R3m | Ge not detected | 0.9 | 0.6 |
| Example 13 | Se | $Ge_{0.90}Bi_{0.05}Cu_{0.05}Te_{0.95}Se_{0.05}$ | quenching | plasma discharge | R3m | Ge not detected | 1.1 | 0.9 |
| Example 14 | Se | $Ge_{0.90}Bi_{0.05}Cu_{0.05}Te_{0.90}Se_{0.10}$ | quenching | plasma discharge | R3m | Ge not detected | 0.7 | 0.3 |

TABLE 6

| No. | Carrier density [$10^{20}$ cm$^{-3}$] | Power factor [μW/(cmK$^2$)] | | | | zT [—] | | | |
|---|---|---|---|---|---|---|---|---|---|
| | | 200° C. | 300° C. | 400° C. | 500° C. | 200° C. | 300° C. | 400° C. | 500° C. |
| Example 6 | 0.85 | 20 | 18 | 28 | 29 | 0.82 | 0.92 | 1.25 | 1.36 |
| Example 13 | 0.91 | 26 | 25 | 32 | 31 | 0.98 | 1.34 | 1.45 | 1.25 |
| Example 14 | 0.68 | 21 | 20 | 30 | 31 | 1.06 | 1.22 | 1.44 | 1.35 |

The compound of Example 13 was prepared by substituting a portion of the tellurium in the compound of Example 6 with selenium, and had a composition of $Ge_{0.90}Bi_{0.05}Cu_{0.05}Te_{0.95}Se_{0.05}$.

tivity of the compound of Example 14 was equal or lower from room temperature to 500° C., and in particular, was markedly lower from room temperature to 350° C. Compared with Example 6, the power factor of the compound of Example 14 was equal or higher within a range from room temperature to 500° C. Compared with Example 6, the zT value for the compound of Example 14 was equal or higher from room temperature to 500° C., and in particular, was markedly higher from room temperature to 450° C.

By producing a compound which contained added selenium in an amount that was double that used in Example 13 in addition to the constituent elements of germanium, tellurium, bismuth and copper, the thermoelectromotive force (the Seebeck coefficient) was increased and the thermal conductivity was reduced. Moreover, zT was able to be increased markedly from room temperature to 450° C.

Because a high power factor can be realized and the zT value can be increased, a thermoelectric conversion device using the above compound as a thermoelectric conversion material is effective from the viewpoint of increasing the thermoelectric conversion efficiency across a broad temperature range. Because the compound exhibits a high thermoelectromotive force and low thermal conductivity, a thermoelectric conversion device using the above compound as a thermoelectric conversion material is effective from the viewpoint of obtaining a high voltage.

INDUSTRIAL APPLICABILITY

The compound the present invention exhibits excellent thermoelectric conversion characteristics even in the high-temperature region near 500° C., and also exhibits superior thermoelectric conversion characteristics across a broad range from room temperature to 500° C., and can therefore be applied in various fields, including waste heat power generation applications for moving bodies such as automobiles, trucks and buses, waste heat power generation applications for production plants, power generation plants and incineration plants, power generation applications from natural heat sources such as geothermal heat and solar heat, and power generation applications from fuel combustion heat.

DESCRIPTION OF REFERENCE SIGNS

11: Thermoelectric conversion element
12: p-type thermoelectric conversion element
13: n-type thermoelectric conversion element
14: Metal electrode
15: First metal electrode
16: Second metal electrode
17: Third metal electrode
18: Insulating plate
19: Insulator
20: Thermoelectric conversion module
21: Thermoelectric conversion device
21': Thermoelectric conversion device
31: Lead wire
32: Lead wire
41: Heat source
42: Heat radiating plate
43: Electrode (negative electrode)
44: Electrode (positive electrode)
43': Electrode (negative electrode)
44': Electrode (positive electrode)
45: External load

The invention claimed is:

1. A compound comprising at least germanium, tellurium, bismuth and copper as constituent elements, wherein a longest axis of ubiquitous bismuth crystals and copper crystals is less than 2.0 μm.

2. The compound according to claim 1, wherein the compound is a germanium telluride doped with bismuth and copper.

3. The compound according to claim 1, having a rhombohedral crystal structure derived from germanium telluride.

4. The compound according to claim 3, wherein the compound is a germanium telluride doped with bismuth and copper.

5. The compound according to claim 3, represented by a chemical formula $Ge_{1+a-b-c}Bi_bCu_cTe$ (wherein $-0.05 \leq a \leq 0.10$, $0 < b \leq 0.10$, and $0 < c \leq 0.10$).

6. The compound according to claim 5, wherein the compound is a germanium telluride doped with bismuth and copper.

7. The compound according to claim 1, represented by a chemical formula $Ge_{1+a-b-c}Bi_bCu_cTe$ (wherein $-0.05 \leq a \leq 0.10$, $0 < b \leq 0.10$, and $0 < c \leq 0.10$).

8. The compound according to claim 7, wherein the compound is a germanium telluride doped with bismuth and copper.

9. The compound according to claim 1, further comprising another element besides germanium, tellurium, bismuth and copper as a constituent element.

10. The compound according to claim 9, wherein the other element is one or more elements selected from the group consisting of lead, silver and selenium.

11. The compound according to claim 9, represented by a chemical formula $Ge_{1+a-b-c-d}Bi_bCu_cM_dTe_{1-e}X_e$ (wherein M represents a metal element other than germanium, bismuth and copper, X represents a non-metal element other than tellurium, and $-0.05 \leq a \leq 0.10$, $0 < b \leq 0.10$, $0 < c \leq 0.10$, $0 < d \leq 0.40$, and $0 < e \leq 0.40$).

12. The compound according to claim 1, having a carrier density of not more than $3.0 \times 10^{20}$ cm$^{-3}$.

13. The compound according to claim 1, wherein striped crystal domains exist, a width of the crystal domains is at least 0.005 μm but not more than 1 μm, and a length of the crystal domains is at least 0.05 μm.

14. The compound according to claim 1, wherein the compound is not a compound containing germanium, tellurium, bismuth, copper, antimony and silver as constituent elements.

15. A thermoelectric conversion material comprising the compound according to claim 1.

16. A method for producing the compound according to claim 1, the method comprising:
a step of mixing raw materials composed of at least elements of germanium, tellurium, bismuth and copper, and melting the raw materials by heating at 720° C. or higher, and
a step of quenching a melt using a liquid of less than 50° C.

* * * * *

UNITED STATES PATENT AND TRADEMARK OFFICE
CERTIFICATE OF CORRECTION

| | | |
|---|---|---|
| PATENT NO. | : 11,063,197 B2 | Page 1 of 1 |
| APPLICATION NO. | : 16/088465 | |
| DATED | : July 13, 2021 | |
| INVENTOR(S) | : Satoshi Shimano et al. | |

It is certified that error appears in the above-identified patent and that said Letters Patent is hereby corrected as shown below:

On the Title Page

Item (71) should read:
Sumitomo Chemical Company, Limited, Tokyo (JP); Riken, Wako-shi, Saitama (JP)

Item (73) should read:
SUMITOMO CHEMICAL COMPANY, LIMITED, Tokyo (JP);
RIKEN, Wako-shi, Saitama (JP)

Signed and Sealed this
Twelfth Day of April, 2022

Drew Hirshfeld
*Performing the Functions and Duties of the
Under Secretary of Commerce for Intellectual Property and
Director of the United States Patent and Trademark Office*